(12) United States Patent
Oh

(10) Patent No.: US 11,315,895 B2
(45) Date of Patent: Apr. 26, 2022

(54) SEMICONDUCTOR MEMORY DEVICE HAVING WAFER-TO-WAFER BONDING STRUCTURE

(71) Applicant: SK hynix Inc., Icheon-si (KR)

(72) Inventor: Sung Lae Oh, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 4 days.

(21) Appl. No.: 17/014,349

(22) Filed: Sep. 8, 2020

(65) Prior Publication Data

US 2021/0313288 A1 Oct. 7, 2021

(30) Foreign Application Priority Data

Apr. 7, 2020 (KR) ........................ 10-2020-0041914

(51) Int. Cl.
| | |
|---|---|
| *G11C 16/04* | (2006.01) |
| *H01L 23/00* | (2006.01) |
| *H01L 25/18* | (2006.01) |
| *G11C 16/08* | (2006.01) |
| *G11C 16/24* | (2006.01) |

(52) U.S. Cl.
CPC ............. *H01L 24/09* (2013.01); *G11C 16/08* (2013.01); *G11C 16/24* (2013.01); *H01L 24/05* (2013.01); *H01L 24/06* (2013.01); *H01L 24/08* (2013.01); *H01L 25/18* (2013.01); *G11C 16/0483* (2013.01); *H01L 2224/05553* (2013.01); *H01L 2224/06177* (2013.01); *H01L 2224/08145* (2013.01); *H01L 2224/09177* (2013.01); *H01L 2924/1431* (2013.01); *H01L 2924/14511* (2013.01)

(58) Field of Classification Search
CPC ..... G11C 16/08; G11C 16/24; G11C 16/0483; H01L 24/09; H01L 24/05; H01L 24/06; H01L 24/08; H01L 25/18; H01L 2224/05553; H01L 2224/06177; H01L 2224/08145; H01L 2224/09177
See application file for complete search history.

(56) References Cited

U.S. PATENT DOCUMENTS 9,558,945 B2 1/2017 Toshiba
10,971,487 B2 * 4/2021 Oh ................... H01L 27/11582
(Continued)

FOREIGN PATENT DOCUMENTS

KR 10-2021-0110995 A1 9/2021
KR 10-2021-0145413 A 12/2021

*Primary Examiner* — Pho M Luu

(57) ABSTRACT

A semiconductor memory device includes first column line pads, having a longer width and a shorter width, defined on one surface of a cell wafer, and coupled to a memory cell array of the cell wafer; second column line pads, having a longer width and a shorter width, defined on one surface of a peripheral wafer that is bonded to the one surface of the cell wafer, coupled to a page buffer circuit of the peripheral wafer, and bonded respectively to the first column line pads; first row line pads defined on the one surface of the cell wafer, and coupled to the memory cell array; and second row line pads defined on the one surface of the peripheral wafer, coupled to a row decoder of the peripheral wafer, and bonded respectively to the first row line pads. The longer widths of the first and second column line pads and the longer widths of the first and second row line pads extend in the same direction.

19 Claims, 24 Drawing Sheets

(56) References Cited

U.S. PATENT DOCUMENTS

| 11,032,626 B2* | 6/2021 | Fairbanks | H04N 21/854 |
| 11,114,152 B1* | 9/2021 | Kim | G11C 11/4091 |
| 2021/0057360 A1* | 2/2021 | Oh | H01L 27/11573 |

* cited by examiner

SEMICONDUCTOR MEMORY DEVICE HAVING WAFER-TO-WAFER BONDING STRUCTURE

CROSS-REFERENCE TO RELATED APPLICATION

The present application claims priority under 35 U.S.C. § 119(a) to Korean Patent Application No. 10-2020-0041914 filed in the Korean Intellectual Property Office on Apr. 7, 2020, which is incorporated herein by reference in its entirety.

BACKGROUND

1. Technical Field

Various embodiments generally relate to a semiconductor technology, and particularly, to a semiconductor memory device which has a wafer-to-wafer bonding structure.

2. Related Art

As the demand for portable phones, mobile memory devices and digital cameras increases, the demand for non-volatile memory devices that are mainly used as memory devices for these products also increases. Among nonvolatile memory devices, a NAND flash memory device is widely used as a data storage device.

Recently, to achieve the large capacity and high performance of a semiconductor memory device, a structure has been proposed in which components included in the semiconductor memory device are fabricated not on a single wafer, but on at least two wafers, and then the wafers are bonded to each other to couple the components.

SUMMARY

Various embodiments are directed to a semiconductor memory device capable of contributing to improvement in yield.

In an embodiment, a semiconductor memory device may include: a plurality of first column line pads, having a longer width and a shorter width, defined on one surface of a cell wafer, and coupled to a memory cell array of the cell wafer; a plurality of second column line pads, having a longer width and a shorter width, defined on one surface of a peripheral wafer that is bonded to the one surface of the cell wafer, coupled to a page buffer circuit of the peripheral wafer, and bonded respectively to the plurality of first column line pads; a plurality of first row line pads defined on the one surface of the cell wafer, and coupled to the memory cell array; and a plurality of second row line pads defined on the one surface of the peripheral wafer, coupled to a row decoder of the peripheral wafer, and bonded respectively to the plurality of first row line pads. The longer widths of the first and second column line pads and the longer widths of the first and second row line pads may extend in the same direction.

In an embodiment, a semiconductor memory device may include: a plurality of first column line pads, defined on one surface of a cell wafer having a memory cell array and a plurality of pass transistor groups coupled to the memory cell array, and coupled to the memory cell array; a plurality of second column line pads, defined on one surface of a peripheral wafer that is bonded to the one surface of the cell wafer, and bonded respectively to the plurality of first column line pads; a plurality of first global line pads defined on the one surface of the cell wafer and coupled in common to at least one of the plurality of pass transistor groups; a plurality of second global line pads defined on the one surface of the peripheral wafer and bonded to the plurality of first global line pads, respectively; a plurality of first block line pads defined on the one surface of the cell wafer and coupled to the plurality of pass transistor groups, respectively; and a plurality of second block line pads defined on the one surface of the peripheral wafer, and bonded to the plurality of first block line pads, respectively. The first and second block line pads may have a size larger than the first and second column line pads and the first and second global line pads. The first and second column line pads and the first and second global line pads may be arranged in a first direction, and the first and second block line pads may be arranged in a second direction different from the first direction.

DETAILED DESCRIPTION

Figure 1:
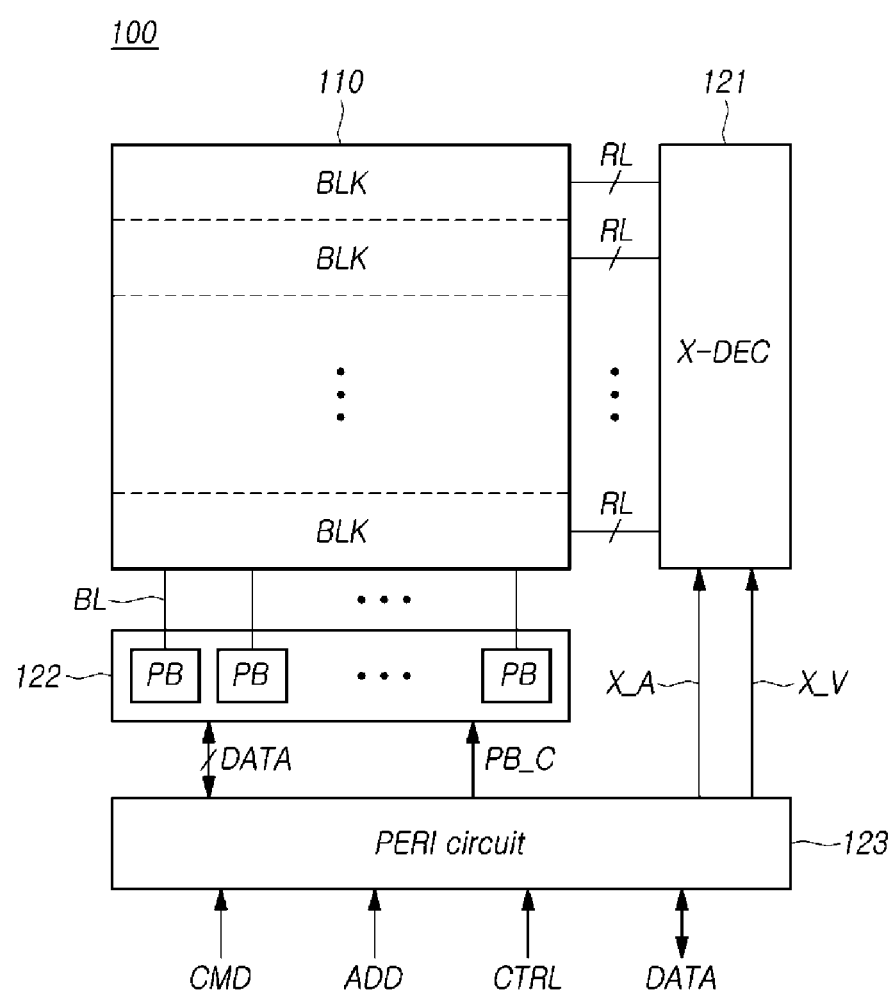
FIG. 1 is a block diagram illustrating a representation of an example of a semiconductor memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various ways. The exemplary embodiments of the present disclosure convey the scope of the disclosure to those skilled in the art.

Since the figures, dimensions, ratios, angles, numbers of elements given in the drawings that describe embodiments of the disclosure are merely illustrative, the present disclosure is not limited to the illustrated matters. Throughout the specification, like reference numerals refer to like components. In describing the disclosure, when it is determined that a detailed description of the related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article, e.g., "a," "an" or "the," is used when referring to a singular noun, this may include a plural of that noun unless specifically stated otherwise. Components in embodiments of the disclosure should be interpreted as including error margins even in the absence of explicit statements.

Also, in describing the components of the disclosure, there may be used terms such as first, second, A, B, (a), and (b). These are solely for the purpose of differentiating one component from another component and do not limit the substances, order, sequence or number of the components. Also, components in embodiments of the disclosure are not limited by these terms. These terms are used to merely distinguish one component from another component. Accordingly, as used herein, a first component may be a second component within the technical spirit of the disclosure.

If a component is described as "connected," "coupled" or "linked" to another component, it should be understood that the component may be directly "connected," "coupled" or "linked" to the another embodiment but still another component may be "interposed" therebetween or the component may be "connected," "coupled" or "linked" to the another component via a still another component. In describing positional relationship, such as "an element A on an element B," "an element A above an element B," "an element A below an element B" and "an element A next to an element B," one or more other elements may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

FIG. 1 is a block diagram illustrating a representation of an example of a semiconductor memory device in accordance with an embodiment of the disclosure.

Referring to FIG. 1, a semiconductor memory device 100 in accordance with an embodiment of the disclosure may include a memory cell array 110, a row decoder (X-DEC) 121, a page buffer circuit 122 and a peripheral circuit (PERI circuit) 123.

The memory cell array 110 may include a plurality of memory blocks BLK. While not illustrated, each of the memory blocks BLK may include a plurality of cell strings. Each cell string may include at least one drain select transistor, a plurality of memory cells and at least one source select transistor, which are coupled in series. Each memory cell may be a volatile memory cell or a nonvolatile memory cell. While it will be described below that the semiconductor memory device 100 is a vertical NAND flash device, it is to be understood that the technical spirit of the disclosure is not limited thereto.

Each of the memory blocks BLK may be coupled to the row decoder 121 through a plurality of row lines RL. The row lines RL may include at least one drain select line, a plurality of word lines and at least one source select line. The memory cell array 110 may be coupled to the page buffer circuit 122 through bit lines BL.

The row decoder 121 may select any one among the memory blocks BLK included in the memory cell array 110 in response to a row address X_A provided from the peripheral circuit 123. The row decoder 121 may transfer an operating voltage X_V, provided from the peripheral circuit 123, to row lines RL coupled to a memory block BLK that is selected from among the memory blocks BLK included in the memory cell array 110.

The page buffer circuit 122 may include a plurality of page buffers PB, which are coupled to the bit lines BL, respectively. The page buffer circuit 122 may receive a page buffer control signal PB_C from the peripheral circuit 123 and may transmit and receive a data signal DATA to and from the peripheral circuit 123. The page buffer circuit 122 may control the bit lines BL, which are arranged in the memory cell array 110, in response to the page buffer control signal PB_C. For example, the page buffer circuit 122 may detect data, stored in a memory cell of the memory cell array 110, by sensing the signal of a bit line BL of the memory cell array 110 in response to the page buffer control signal PB_C, and may transmit the data signal DATA to the peripheral circuit 123 depending on the detected data. The page buffer circuit 122 may apply a signal to a bit line BL, based on the data signal DATA received from the peripheral circuit 123, in response to the page buffer control signal PB_C, and thereby, may write data in a memory cell of the memory cell array 110. The page buffer circuit 122 may write data in or read data from memory cells which are coupled to an activated word line.

The peripheral circuit 123 may receive a command signal CMD, an address signal ADD and a control signal CTRL from outside the semiconductor memory device 100, and may transmit and receive data DATA to and from a device outside the semiconductor memory device 100, such as for example, a memory controller. The peripheral circuit 123 may output signals for writing data in the memory cell array 110 or reading data from the memory cell array 110, for example, the row address X_A, the page buffer control signal PB_C and so forth, based on the command signal CMD, the address signal ADD and the control signal CTRL. The peripheral circuit 123 may generate various voltages including the operating voltage X_V, which are required in the semiconductor memory device 100.

Hereinbelow, in the accompanying drawings, two directions that are parallel to the main surface of a substrate and intersect with each other are defined as a first direction FD and a second direction SD, respectively, and a direction that vertically projects from the main surface of the substrate is defined as a third direction TD. For example, the first direction FD may correspond to the extending direction of word lines and/or the arrangement direction of bit lines, and the second direction SD may correspond to the extending direction of the bit lines and/or the arrangement direction of the word lines. The first direction FD and the second direction SD may substantially perpendicularly intersect with each other. The third direction TD may correspond to a direction that is perpendicular to the first direction FD and the second direction SD. In the following descriptions, the term 'vertical' or 'vertical direction' will be used as substantially the same meaning as the third direction TD. In the drawings, a direction indicated by an arrow and a direction opposite thereto represent the same direction.

Figure 2:
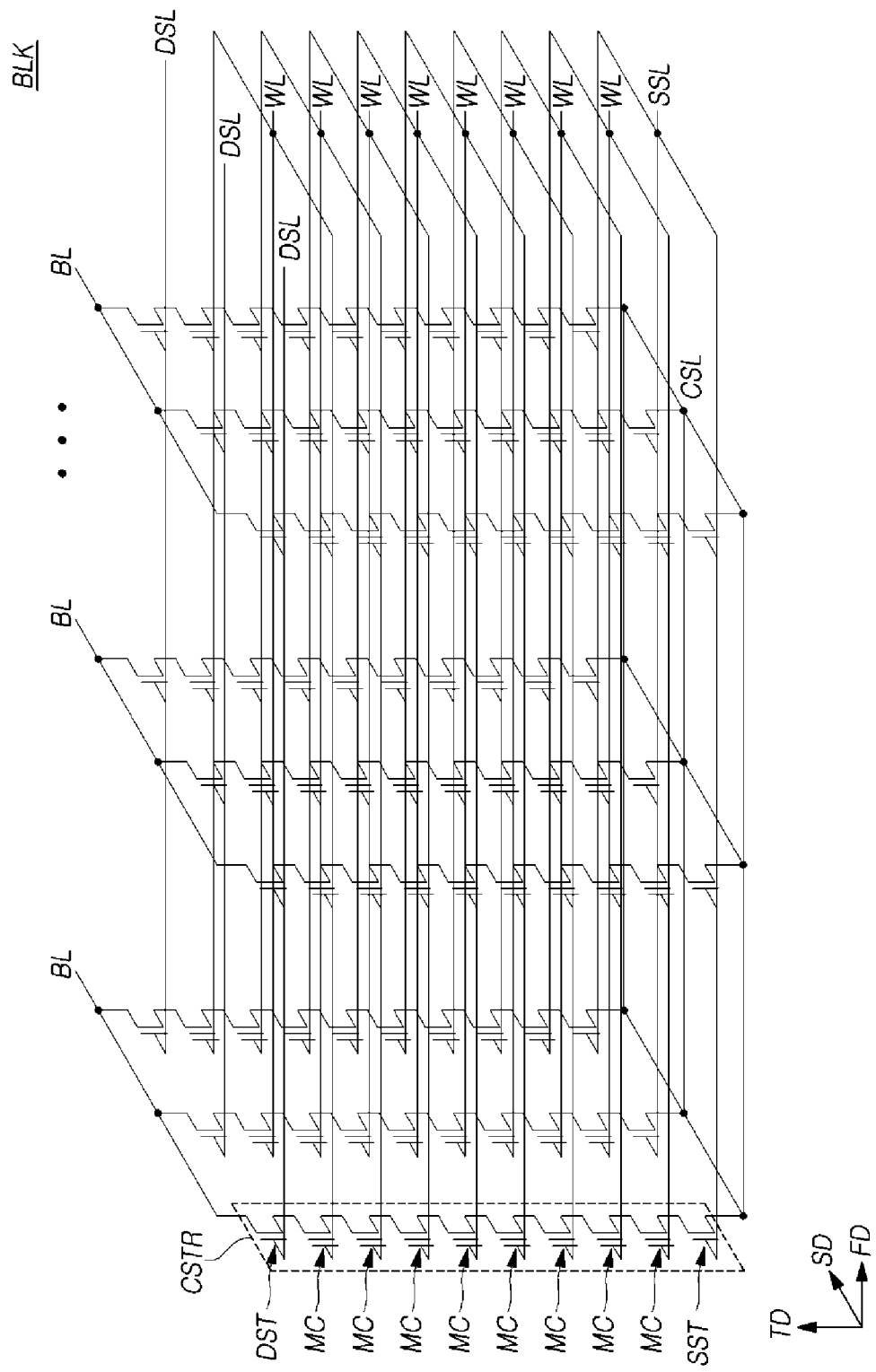
FIG. 2 is an equivalent circuit diagram illustrating a memory block illustrated in FIG. 1.

FIG. 2 is an equivalent circuit diagram illustrating a memory block illustrated in FIG. 1.

Referring to FIG. 2, a memory block BLK may include a plurality of cell strings CSTR, which are coupled between a plurality of bit lines BL and a common source line CSL. The bit lines BL may extend in the second direction SD, and may be arranged in the first direction FD. A plurality of cell strings CSTR may be coupled in parallel to each of the bit lines BL. The cell strings CSTR may be coupled in common to one common source line CSL. The plurality of cell strings CSTR may be coupled between the plurality of bit lines BL and the one common source line CSL.

Each of the cell strings CSTR may include a drain select transistor DST that is coupled to a bit line BL, a source select transistor SST that is coupled to the common source line CSL, and a plurality of memory cells MC, which are coupled between the drain select transistor DST and the source select transistor SST. The drain select transistor DST, the memory cells MC and the source select transistor SST may be coupled in series in the third direction TD.

Drain select lines DSL, a plurality of word lines WL and a source select line SSL may be stacked between the bit lines BL and the common source line CSL in the third direction TD. Each of the drain select lines DSL may be coupled to the gates of corresponding drain select transistors DST. Each of the word lines WL may be coupled to the gates of corresponding memory cells MC. The source select line SSL may be coupled to the gates of source select transistors SST.

Memory cells MC included in the memory block BLK may be divided into physical page units or logical page units. For example, memory cells MC that share one word line WL and are coupled to different cell strings CSTR may configure one physical page PG. Such a page may be used as the basic unit of a read operation.

FIG. 2 illustrates an example in which one drain select transistor DST and one source select transistor SST are provided in each of the cell strings CSTR. However, it is to be noted that in other instances, at least two drain select transistors and/or at least two source select transistors may be included in each of the cell strings CSTR.

Figure 3:
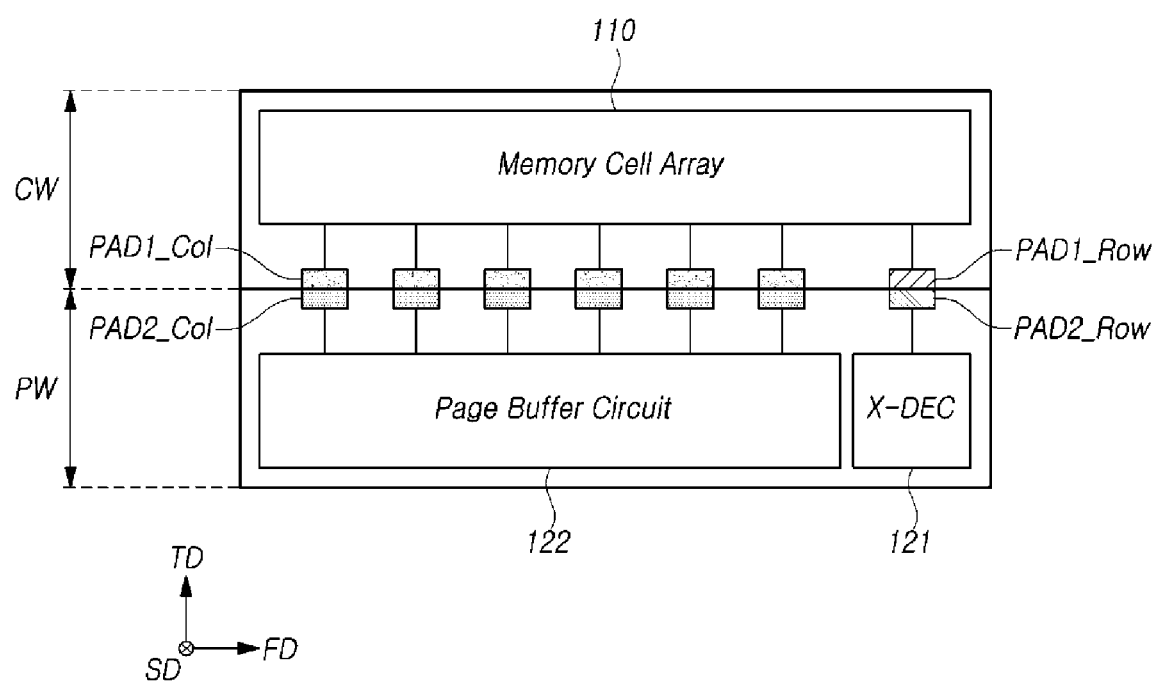
FIG. 3 is a schematic cross-sectional view illustrating a representation of a semiconductor memory device in accordance with an embodiment of the disclosure.

FIG. 3 is a schematic cross-sectional view illustrating a representation of a semiconductor memory device in accordance with an embodiment of the disclosure.

Referring to FIG. 3, a semiconductor memory device in accordance with an embodiment of the disclosure may include a peripheral wafer PW and a cell wafer CW that is stacked on the peripheral wafer PW. FIG. 3 illustrates a case in which one cell wafer CW is stacked on the peripheral wafer PW, but the number of cell wafers CW stacked on the peripheral wafer PW may be two or more.

The cell wafer CW may include a memory cell array 110. The cell wafer CW may include, on one surface thereof, a plurality of first column line pads PAD1_Col and a plurality of first row line pads PAD1_Row, and the one surface may be used to bond the cell wafer CW to the peripheral wafer PW. The first column line pads PAD1_Col may be coupled respectively to bit lines (not illustrated) of the memory cell array 110. The first row line pads PAD1_Row may be coupled respectively to row lines (not illustrated) of the memory cell array 110. FIG. 3 illustrates only one first row line pad PAD1_Row, but it should be understood that the plurality of first row line pads PAD1_Row corresponding respectively to the plurality of row lines of the memory cell array 110 are provided.

The peripheral wafer PW may include a row decoder 121 and a page buffer circuit 122. Although not illustrated, the peripheral wafer PW may further include a peripheral circuit (123 of FIG. 1). The peripheral wafer PW may include, on one surface thereof, a plurality of second column line pads PAD2_Col and a plurality of second row line pads PAD2_Row, and the peripheral wafer PW may be bonded to the cell wafer CW through the one surface.

The plurality of second column line pads PAD2_Col may be coupled to the page buffer circuit 122. The plurality of second row line pads PAD2_Row may be coupled to the row decoder 121. As the cell wafer CW is bonded onto the peripheral wafer PW, the first column line pads PAD1_Col and the second column line pads PAD2_Col that correspond to each other may be coupled to each other, and the first row line pads PAD1_Row and the second row line pads PAD2_Row that correspond to each other may be coupled to each other.

Figure 4A:
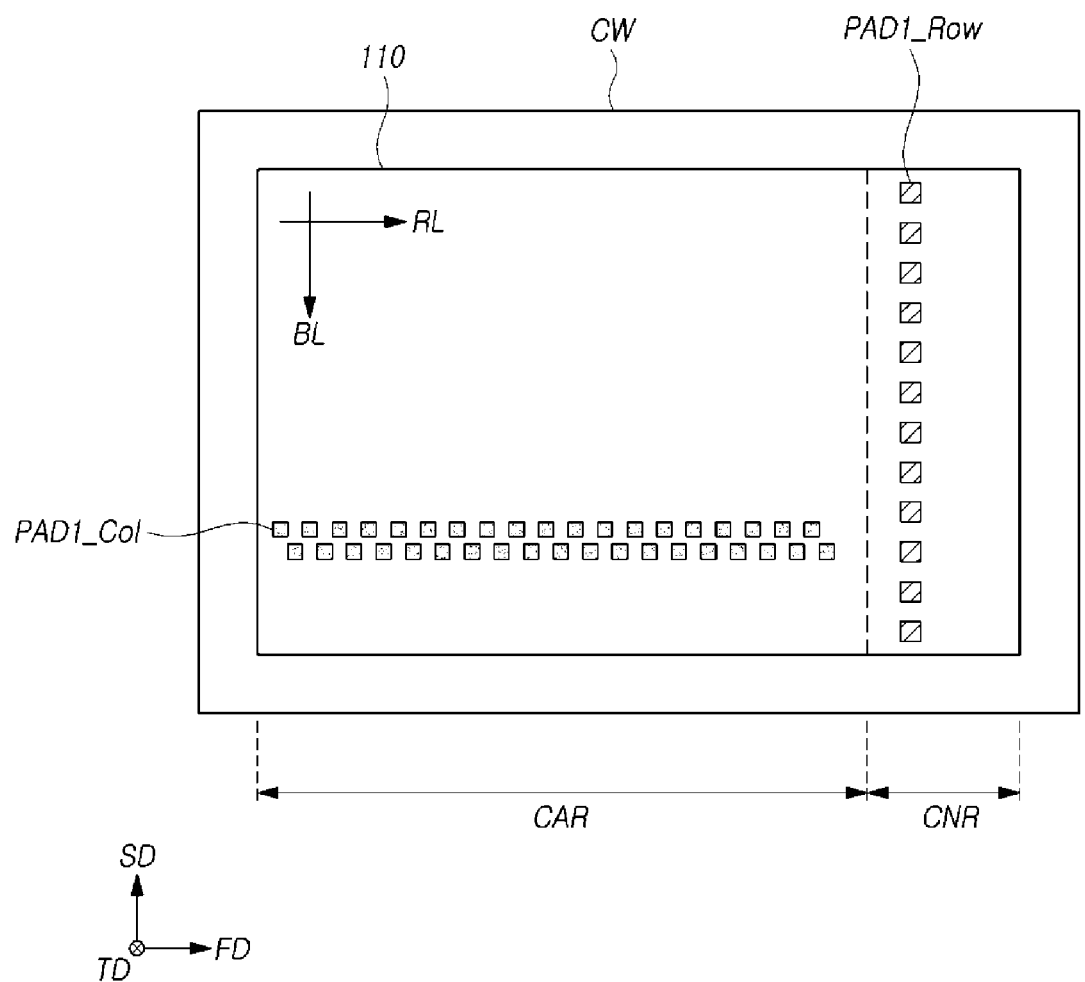
FIG. 4A is a schematic top view illustrating a representation of a cell wafer related to the disclosure.
Figure 4B:
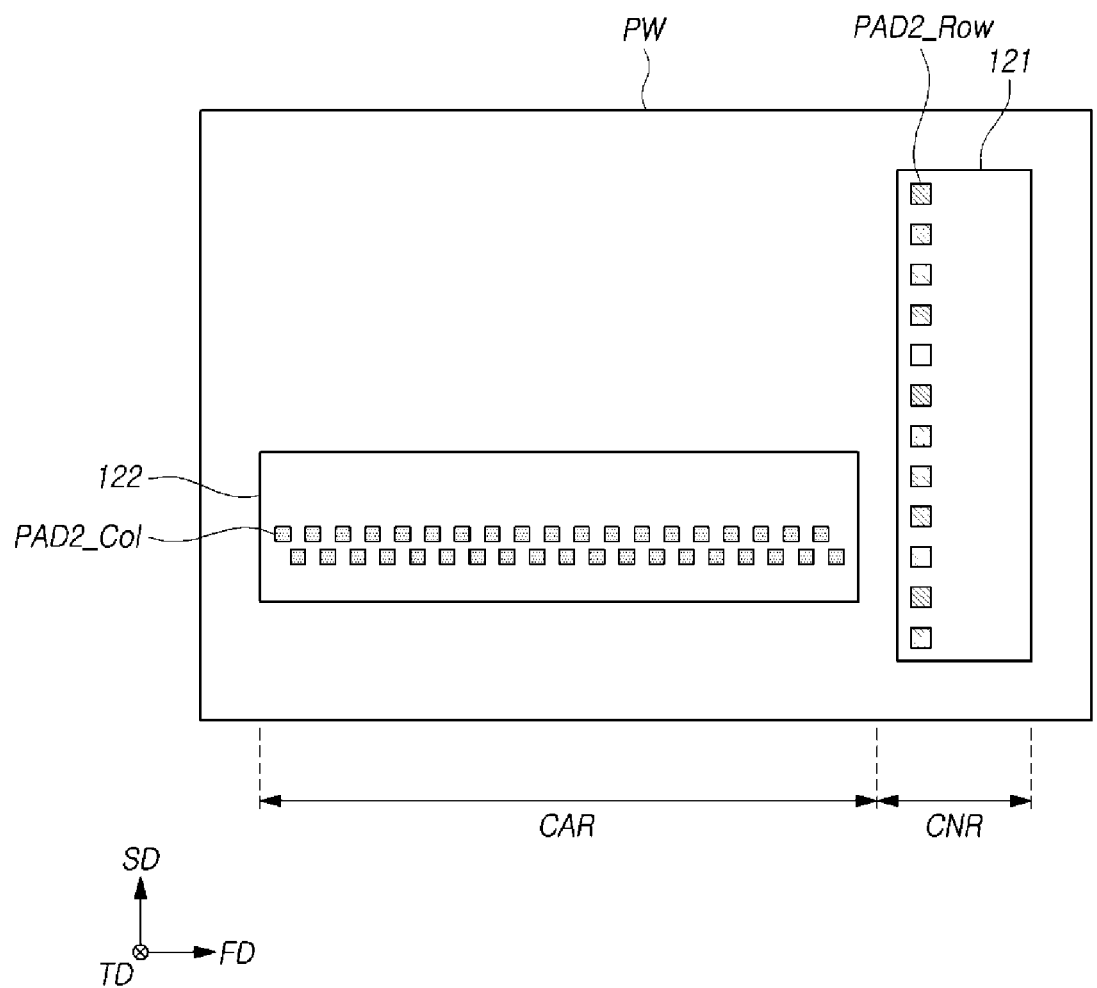
FIG. 4B is a schematic top view illustrating a representation of a peripheral wafer related to the disclosure.

FIG. 4A is a schematic top view illustrating a representation of a cell wafer related to the disclosure, and FIG. 4B is a schematic top view illustrating a representation of a peripheral wafer related to the disclosure.

Referring to FIG. 4A, a semiconductor memory device and/or a cell wafer CW may include a cell region CAR and a coupling region CNR. The cell region CAR and the coupling region CNR may be disposed, adjacent to each other, in the first direction FD. While not illustrated in detail, the cell wafer CW may include a plurality of memory cells, and a plurality of row lines RL and a plurality of bit lines BL that are coupled to the plurality of memory cells. The plurality of memory cells may be disposed in the cell region CAR. The row lines RL may extend in the first direction FD and be arranged in the second direction SD. The bit lines BL may extend in the second direction SD, and may be arranged in the first direction FD.

Referring to FIGS. 4A and 4B, as the degree of integration of semiconductor memory devices is increased and the operation speed thereof is increased, it is desirable to reduce the delay of signals provided from a row decoder 121 to the row lines RL. To this end, circuits configuring the row decoder 121 are disposed in the coupling region CNR to have a shape extending in the second direction SD, which is a direction in which the row lines RL are arranged. In addition, first row line pads PAD1_Row, which are coupled to the row lines RL, and second row line pads PAD2_Row, which are coupled to the row decoder 121, are disposed in the coupling region CNR and are arranged in the second direction SD, which is a direction in which the row lines RL are arranged.

As the degree of integration of semiconductor memory devices is increased and the operation speed thereof is increased, it is desirable to reduce the delay of signals applied from a page buffer circuit 122 to the bit lines BL and/or signals received from the bit lines BL to the page buffer circuit 122. To this end, circuits configuring the page buffer circuit 122 are disposed in the cell region CAR to have a shape extending in the first direction FD, which is a direction in which the bit lines BL are arranged. In addition, first column line pads PAD1_Col, which are coupled to the bit lines BL, and second column line pads PAD2_Col, which are coupled to the page buffer circuit 122, are disposed in the cell region CAR and are arranged in the first direction FD, which is a direction in which the bit lines BL are arranged.

When bonding the cell wafer CW and the peripheral wafer PW, it can be difficult to align the first column line pads PAD1_Col and the second column line pads PAD2_Col, which are arranged in the first direction FD, and at the same time align the first row line pads PAD1_Row and the second row line pads PAD2_Row, which are arranged in the second direction SD. Accordingly, it is highly likely that pad coupling failures may occur during wafer bonding.

For example, when bonding the cell wafer CW and the peripheral wafer PW, if the cell wafer CW and the peripheral wafer PW are aligned in the first direction FD, then pad alignment accuracy in the first direction FD may be increased, however, pad alignment accuracy in the second direction SD cannot be ensured, so pad alignment accuracy in the second direction SD may decrease. For this reason, there is a high possibility that a coupling failure may occur between the first row line pads PAD1_Row and the second row line pads PAD2_Row, which are arranged in the second direction SD. As another example, when bonding the cell wafer CW and the peripheral wafer PW, if the cell wafer CW and the peripheral wafer PW are aligned in the second direction SD, then pad alignment accuracy in the second direction SD may be increased, however, pad alignment accuracy in the first direction FD cannot be secured, so pad alignment accuracy in the first direction FD may decrease. For this reason, there is a high possibility that a coupling failure may occur between the first column line pads PAD1_Col and the second column line pads PAD2_Col, which are arranged in the first direction FD. Embodiments of the disclosure suggest ways of reducing such pad coupling failures.

Figure 5:
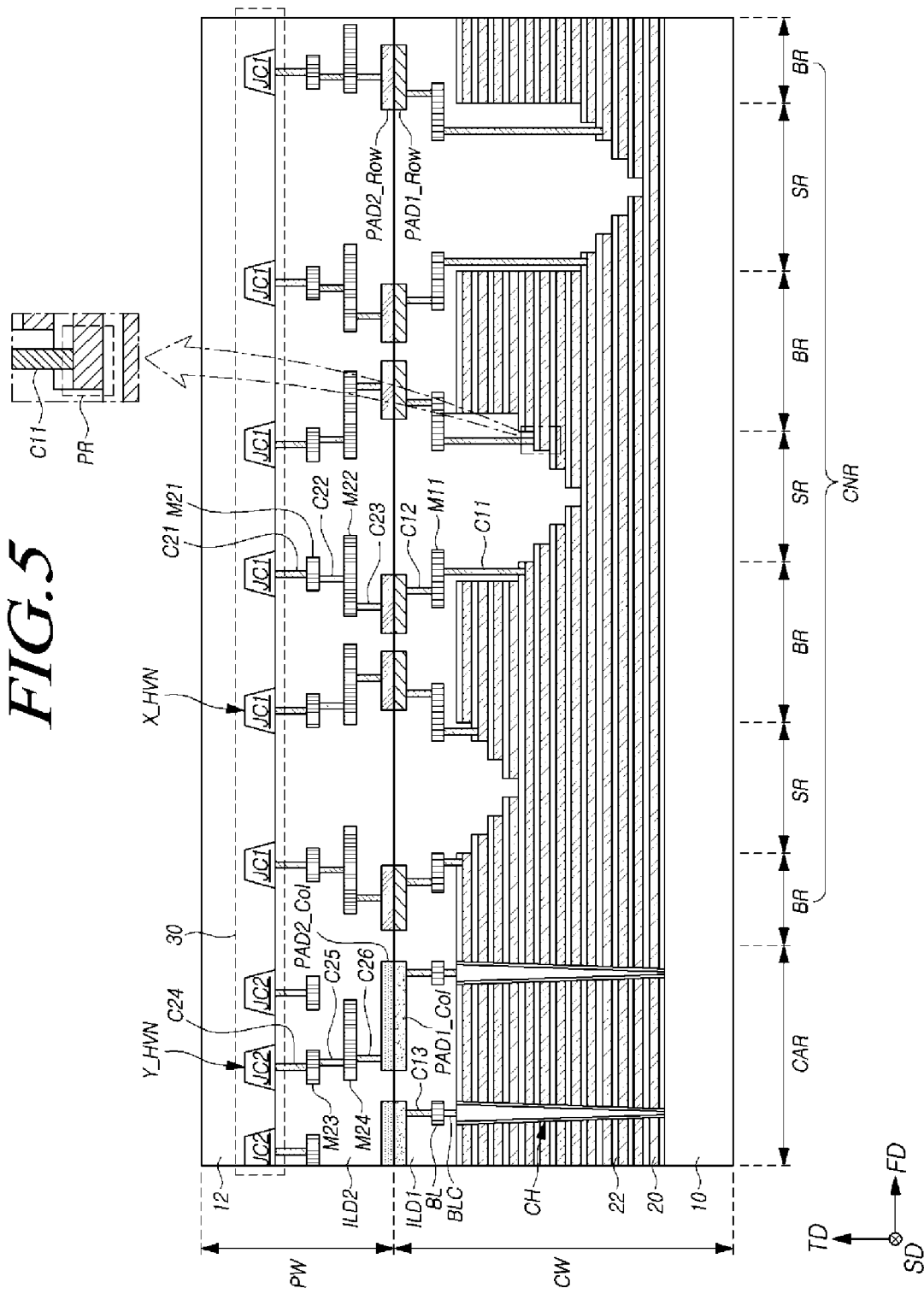
FIG. 5 is a cross-sectional view illustrating a representation of a semiconductor memory device in accordance with an embodiment of the disclosure.

FIG. 5 is a cross-sectional view illustrating a representation of a semiconductor memory device in accordance with an embodiment of the disclosure.

Referring to FIG. 5, a cell wafer CW may include a first substrate 10, and a plurality of electrode layers 20 and a plurality of interlayer dielectric layers 22, which are alternately stacked on the first substrate 10. The first substrate 10 may include, for example, at least one selected from the group including a monocrystalline silicon layer, an SOI (silicon on insulator) layer, a silicon layer formed on a silicon germanium (SiGe) layer, a monocrystalline silicon layer formed on a dielectric layer, and a polysilicon layer formed on a dielectric layer.

The electrode layers 20 may include a conductive material. For example, the electrode layers 20 may include at least one selected among a doped semiconductor (e.g., doped silicon), a metal (e.g., tungsten, copper or aluminum), conductive metal nitride (e.g., titanium nitride or tantalum nitride) and a transition metal (e.g., titanium or tantalum). The interlayer dielectric layers 22 may include silicon oxide. The electrode layers 20 may configure row lines. Among the electrode layers 20, at least one electrode layer 20, when viewed from the lowermost electrode layer 20, may configure a source select line. Among the electrode layers 20, at least one electrode layer 20, when viewed from the uppermost electrode layer 20, may configure a drain select line. The electrode layers 20 between the source select line and the drain select line may configure word lines.

A plurality of vertical channels CH, which pass through the plurality of electrode layers 20 and the plurality of interlayer dielectric layers 22, may be defined in a cell region CAR. While not illustrated, the vertical channels CH may include a channel layer and a gate dielectric layer. The channel layer may include polysilicon or monocrystalline silicon, and may include, in some regions thereof, a P-type impurity such as boron (B). The gate dielectric layer may include a tunnel dielectric layer, a charge storage layer and a blocking layer, which are sequentially stacked from the outer wall of the channel layer. In some embodiments, the gate dielectric layer may have an ONO (oxide-nitride-oxide) stack structure in which an oxide layer, a nitride layer and an oxide layer are sequentially stacked. Source select transistors may be configured in regions or areas in which the source select line surrounds the vertical channels CH. Memory cells may be configured in regions or areas in which the word lines surround the vertical channels CH. Drain select transistors may be configured in regions or areas in which the drain select line surrounds the vertical channels CH. The cell region CAR may be defined as a region in which memory cells are located.

Bit lines BL may be defined over the vertical channels CH in the third direction TD. Bit line contacts BLC may be defined under the bit lines BL to couple the bit lines BL and the vertical channels CH.

In a coupling region CNR, each of the electrode layers 20 may have a pad region PR which is exposed by staggering the ends of other electrode layers 20 positioned thereon. A contact C11 may be coupled to the pad region PR of each electrode layer 20. A plurality of step structures, which are defined by the pad regions PR of the electrode layers 20, may be defined in the coupling region CNR.

The coupling region CNR may be divided into a plurality of step regions SR and a plurality of buffer regions BR. The plurality of step regions SR may be arranged in the first direction FD. Each of the buffer regions BR may be disposed between neighboring step regions SR. The plurality of step regions SR and the plurality of buffer regions BR may be alternately disposed in the first direction FD. The step structures may be disposed in the step regions SR, respectively.

A first dielectric layer ILD1 may be defined on the first substrate 10 to cover the plurality of electrode layers 20, the plurality of interlayer dielectric layers 22, and the vertical channels CH. A top surface of the dielectric layer ILD1 may configure one surface of the cell wafer CW, which is bonded to a peripheral wafer PW. A plurality of first row line pads PAD1_Row and a plurality of first column line pads PAD1_Col may be defined on the one surface of the cell wafer CW. Each of the plurality of first row line pads PAD1_Row may be coupled to one of the electrode layers 20 through contacts C11 and C12 and a wiring line M11. Each of the plurality of first column line pads PAD1_Col may be coupled to one of the bit lines BL through a contact C13. Although FIG. 5 illustrates only a first row of line pads PAD1_Row, which are coupled to some of the plurality of electrode layers 20, it should be understood that the plurality of first row line pads PAD1_Row corresponding respectively to the plurality of electrode layers 20 are provided, and that each electrode layer 20 is coupled to a corresponding first row line pad PAD1_Row through the contacts C11 and C12 and the wiring line M11.

The peripheral wafer PW may include a second substrate 12 and a logic circuit 30 that is defined on the second substrate 12. The logic circuit 30 may include a plurality of pass transistors X_HVN and a plurality of bit line select transistors Y_HVN. The plurality of pass transistors X_HVN may be included in a row decoder (121 of FIG. 3), and the plurality of bit line select transistors Y_HVN may be included in a page buffer circuit (122 of FIG. 3). The reference symbol JC1 denotes the junction region of the pass transistor X_HVN, and the reference symbol JC2 denotes the junction region of the bit line select transistor Y_HVN.

A dielectric layer ILD2 may be defined on the second substrate 12 to cover the logic circuit 30. The bottom surface of the dielectric layer ILD2 may configure one surface of the peripheral wafer PW, which is bonded to the cell wafer CW. A plurality of second row line pads PAD2_Row and a plurality of second column line pads PAD2_Col may be defined on the one surface of the peripheral wafer PW. Each of the plurality of second row line pads PAD2_Row may be coupled to one of the pass transistors X_HVN through contacts C21, C22 and C23 and wiring lines M21 and M22. Each of the plurality of second column line pads PAD2_Col may be coupled to one of the bit line select transistors Y_HVN through contacts C24, C25 and C26 and wiring lines M23 and M24. Although FIG. 5 illustrates some second column line pads PAD2_Col that are coupled to some of the plurality of bit line select transistors Y_HVN, it should be understood that the plurality of second column line pads PAD2_Col corresponding respectively to the plurality of bit line select transistors Y_HVN are provided, and that each bit line select transistor Y_HVN is coupled to a corresponding second column line pad PAD2_Col through the contacts C24, C25 and C26 and the wiring lines M23 and M24.

The cell wafer CW may be bonded onto the peripheral wafer PW such that the first column line pads PAD1_Col and the second column line pads PAD2_Col that correspond to each other are coupled to each other, and the first row line pads PAD1_Row and the second row line pads PAD2_Row that correspond to each other are coupled to each other.

FIGS. 6 to 9 are top views illustrating representations of layouts of semiconductor memory devices in accordance with embodiments of the disclosure.

Figure 6:
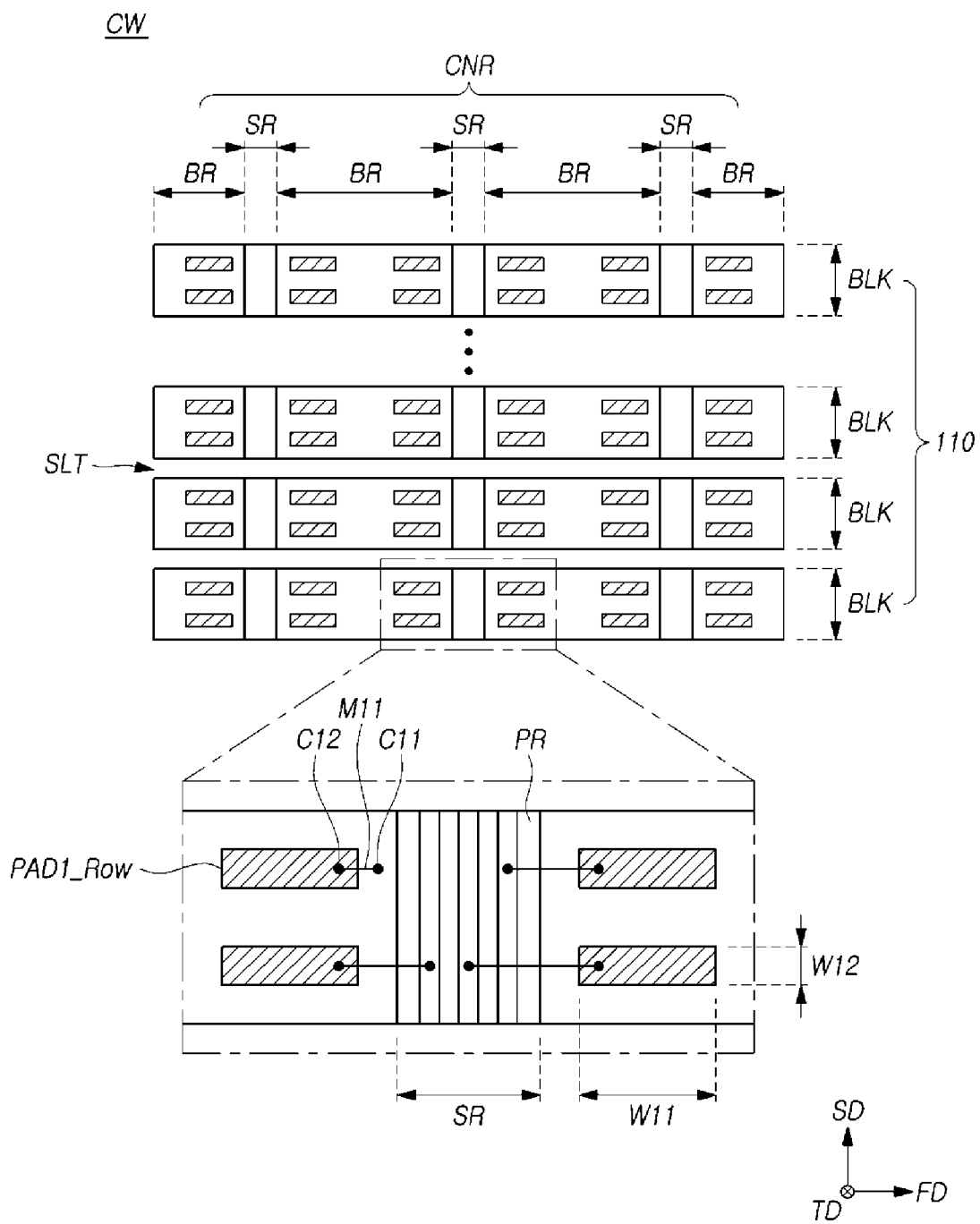
FIG. 6 is a top view illustrating a representation of a layout of pads, in a coupling region, of a cell wafer in accordance with an embodiment of the disclosure.
Figure 7:
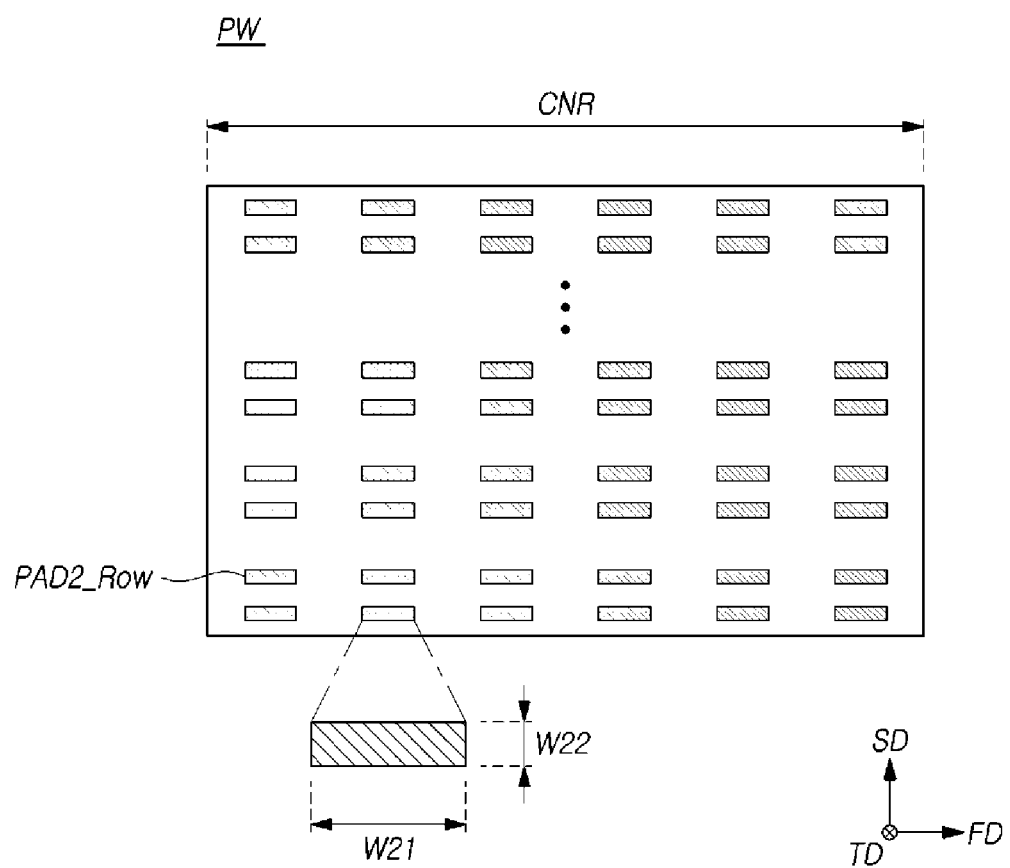
FIG. 7 is a top view illustrating a representation of a layout of pads, in a coupling region, of a peripheral wafer in accordance with the embodiment of the disclosure.
Figure 8:
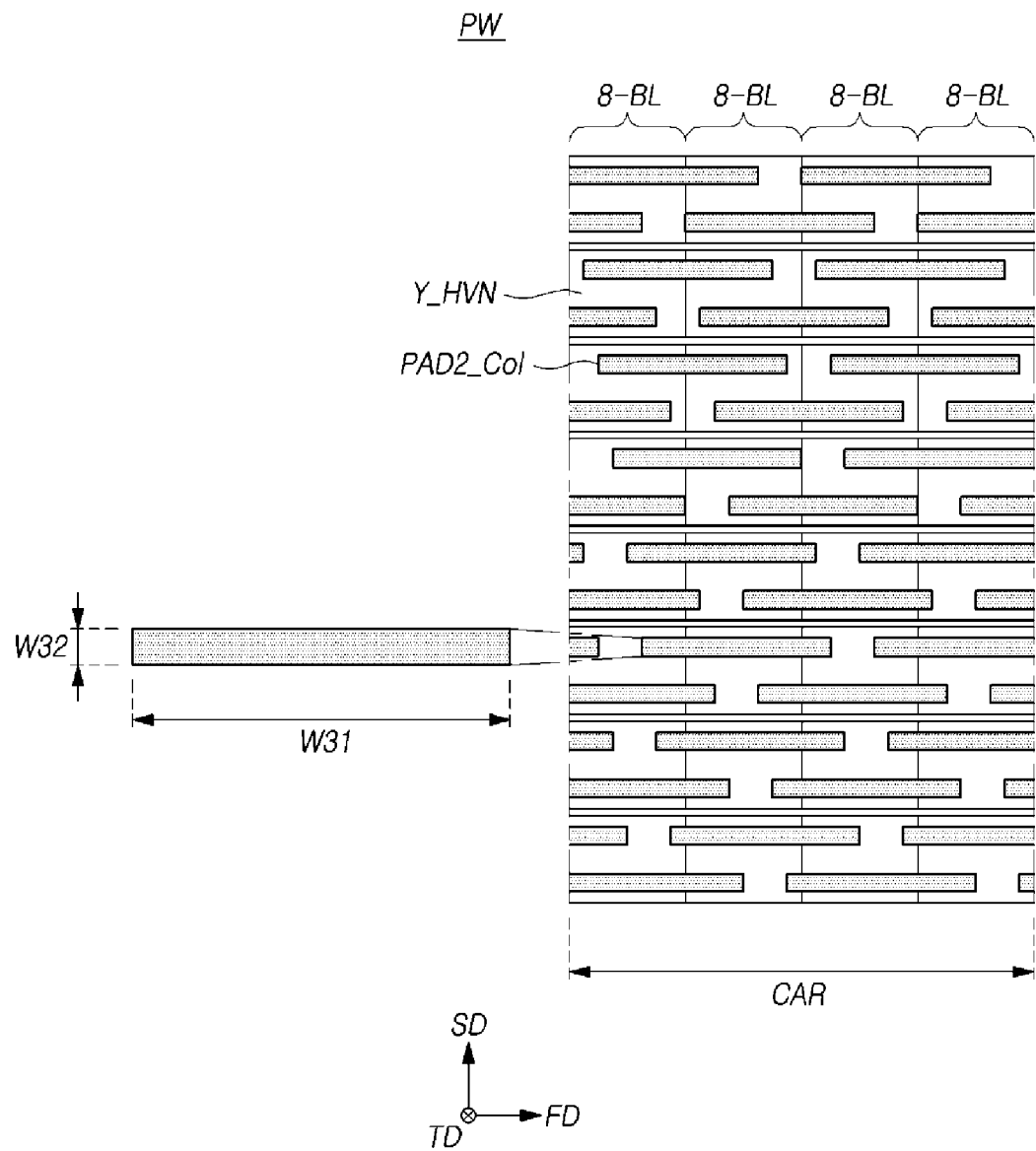
FIG. 8 is a top view illustrating a representation of a layout of pads, in a cell region, of the peripheral wafer in accordance with the embodiment of the disclosure.
Figure 9:
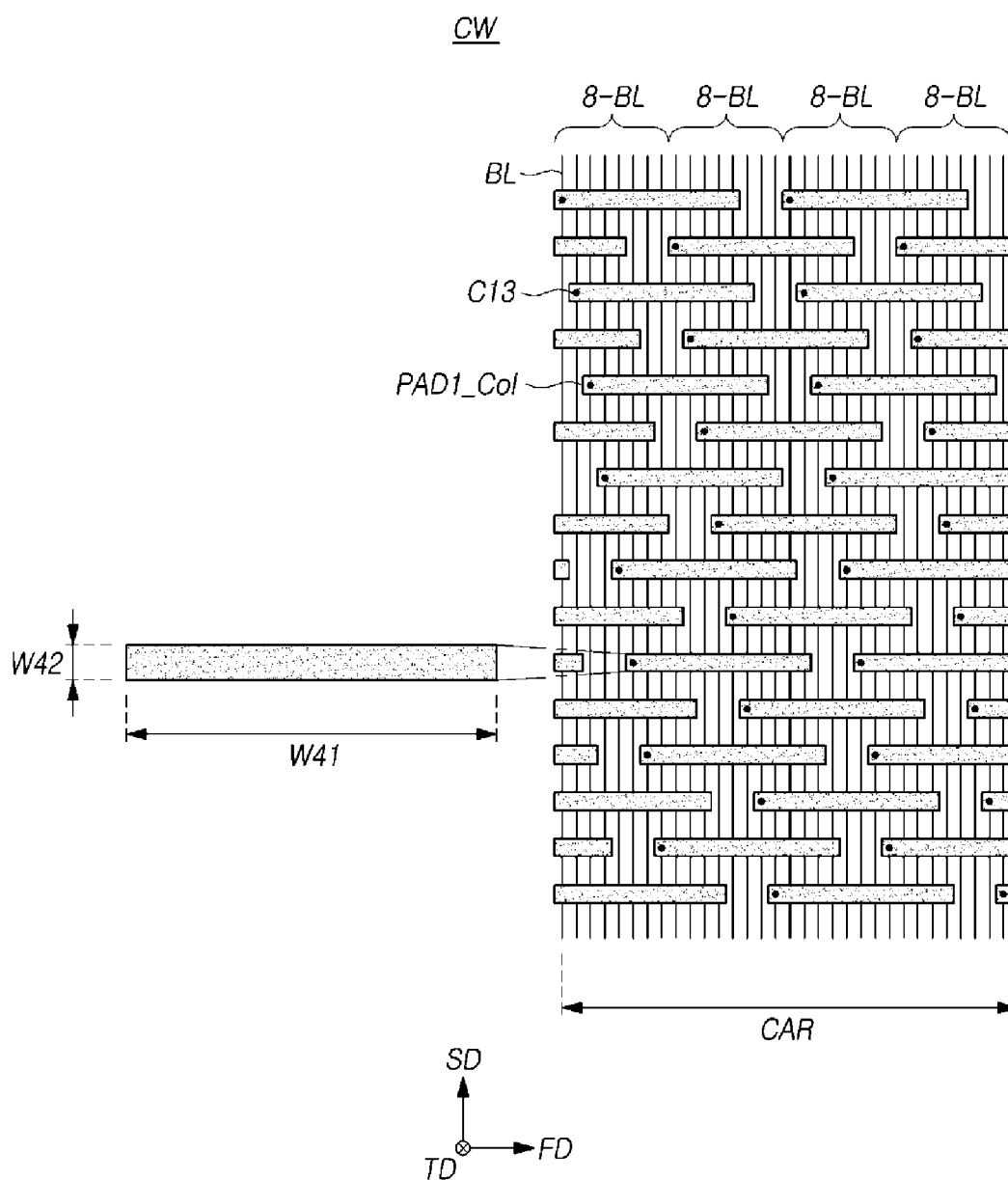
FIG. 9 is a top view illustrating a representation of a layout of pads, in a cell region, of the cell wafer in accordance with the embodiment of the disclosure.

In detail, FIG. 6 is a top view illustrating a representation of a coupling region CNR of a cell wafer CW in accordance with an embodiment of the disclosure, FIG. 7 is a top view illustrating a representation of a coupling region CNR of a peripheral wafer PW in accordance with an embodiment of the disclosure, FIG. 8 is a top view illustrating a representation of a cell region CAR of a peripheral wafer PW in accordance with an embodiment of the disclosure, and FIG. 9 is a top view illustrating a representation of a cell region CAR of a cell wafer CW in accordance with an embodiment of the disclosure.

Referring to FIG. 6, a memory cell array 110, which is defined in the cell wafer CW, may include a plurality of memory blocks BLK. A plurality of slits SLT that divide a plurality of electrode layers (20 of FIG. 5) and a plurality of interlayer dielectric layers (22 of FIG. 5) may be defined. The plurality of slits SLT may extend in the first direction FD, and may be arranged in the second direction SD. Each memory block BLK may be disposed between a pair of adjacent slits SLT. The memory blocks BLK may extend in the first direction FD, and may be arranged in the second direction SD.

A plurality of first row line pads PAD1_Row may be defined in the coupling region CNR of the cell wafer CW. The plurality of first row line pads PAD1_Row may overlap with the memory blocks BLK in the third direction TD. Each of the first row line pads PAD1_Row may be coupled to a pad region PR through contacts C11 and C12 and a wiring line M11. A plurality of first row line pads PAD1_Row, which are coupled to a plurality of pad regions PR defined in one step region SR, may be disposed in a pair of buffer regions BR adjacent to and arranged in opposite directions from the one step region SR in the first direction FD. A plurality of first row line pads PAD1_Row may be arranged in the first direction FD and the second direction SD within a memory block BLK.

The width of the first row line pad PAD1_Row in the first direction FD may be W11, and the width of the first row line pad PAD1_Row in the second direction SD may be W12. W11 may be larger than W12. The first row line pads PAD1_Row may have an elongated shape in the first direction FD. The longer width direction of the first row line pads PAD1_Row may be the first direction FD, and the shorter width direction of the first row line pads PAD1_Row may be the second direction SD.

Referring to FIG. 7, a plurality of second row line pads PAD2_Row may be defined in the coupling region CNR of the peripheral wafer PW. Similar to the first row line pads PAD1_Row (see FIG. 6), the second row line pads PAD2_Row may be two-dimensionally arranged in the first direction FD and the second direction SD. The width of the second row line pad PAD2_Row in the first direction FD may be W21, and the width of the second row line pad PAD2_Row in the second direction SD may be W22. W21 may be larger than W22. The second row line pads PAD2_Row may have an elongated shape in the first direction FD. The longer width direction of the second row line pads PAD2_Row may be the first direction FD, and the shorter width direction of the second row line pads PAD2_Row may be the second direction SD.

Referring to FIG. 8, bit line select transistors Y_HVN of a page buffer circuit may be disposed in the cell region CAR of the peripheral wafer PW. The bit line select transistors Y_HVN may be two-dimensionally arranged in the first direction FD and the second direction SD. The bit line select transistors Y_HVN may configure a page buffer high-voltage circuit.

The box denoted by the reference symbol Y_HVN represents a region in which a unit bit line select transistor is disposed, and does not denote an actual bit line select transistor. The width, in the first direction FD, of the box denoted by the reference symbol Y_HVN may correspond to the pitch, in the first direction FD, of the bit line select transistor, and the width, in the second direction SD, of the box denoted by reference symbol Y_HVN may correspond to the pitch, in the second direction SD, of the bit line select transistor. Hereinafter, for the sake of convenience in explanation, the region where the bit line select transistor is disposed will be denoted by using the same reference symbol as that of the bit line select transistor.

Eight bit lines BL may be disposed within the pitch of the bit line select transistor Y_HVN in the first direction FD. The pitch of the bit line select transistor Y_HVN in the first direction FD may correspond to eight times the pitch of the bit line BL. Eight bit line select transistors Y_HVN may be arranged in the second direction SD, and the page buffer high-voltage circuit may be defined as being configured by eight rows. That is to say, the number of the bit line select transistors Y_HVN disposed in one column may be the same as the number of the bit lines BL disposed within the pitch of the bit line select transistor Y_HVN in the first direction FD. Therefore, if the pitch of the bit line select transistor Y_HVN in the first direction FD is changed, then the number of the bit line select transistors Y_HVN disposed in one column may also be changed. However, embodiments contemplated by this disclosure are not limited thereto, and in other embodiments the number of the bit line select transistors Y_HVN disposed in one column may be different from the number of the bit lines BL disposed within the pitch of the bit line select transistor Y_HVN in the first direction FD.

Although FIG. 8 illustrates a page buffer high-voltage circuit with four columns for the sake of convenience in explanation, a page buffer high-voltage circuit may be configured by a larger number of columns in conformity with the size of a memory cell array.

A plurality of second column line pads PAD2_Col may be disposed in the cell region CAR of the peripheral wafer PW. The plurality of second column line pads PAD2_Col may overlap with the bit line select transistors Y_HVN in the third direction TD. Similar to the bit line select transistors Y_HVN, which are two-dimensionally arranged in the first direction FD and the second direction SD, the second column line pads PAD2_Col may be two-dimensionally arranged in the first direction FD and the second direction SD.

The width of the second column line pad PAD2_Col in the first direction FD may be W31, and the width of the second column line pad PAD2_Col in the second direction SD may be W32. W31 may be larger than W32. The second column line pads PAD2_Col may have an elongated shape in the first direction FD. The longer width direction of the second column line pads PAD2_Col may be the first direction FD, and the shorter width direction of the second column line pads PAD2_Col may be the second direction SD.

The width of the second column line pad PAD2_Col in the first direction FD may be larger than the pitch of the bit line select transistors Y_HVN in the first direction FD. Each second column line pad PAD2_Col may overlap with at least two bit line select transistors Y_HVN that are adjacent to each other in the first direction FD. The width of the second column line pad PAD2_Col in the second direction SD may be smaller than the pitch of the bit line select transistors Y_HVN in the second direction SD. For example, the width of each second column line pad PAD2_Col in the second direction SD may be smaller than half the pitch of the bit line select transistors Y_HVN in the second direction SD.

Referring to FIG. 9, a plurality of bit lines BL may be disposed in the cell region CAR of the cell wafer CW. The bit lines BL may extend in the second direction SD, and may be arranged in the first direction FD. A plurality of first column line pads PAD1_Col may be disposed in the cell region CAR of the cell wafer CW. Each of the first column line pads PAD1_Col may be coupled to one of the bit lines BL through a contact C13.

Similar to the second column line pads PAD2_Col (see FIG. 8), the first column line pads PAD1_Col may be two-dimensionally arranged in the first direction FD and the second direction SD. The width of the first column line pad PAD1_Col in the first direction FD may be W41, and the width of the first column line pad PAD1_Col in the second direction SD may be W42. W41 may be larger than W42. The first column line pads PAD1_Col may have an elongated shape in the first direction FD. The longer width direction of the first column line pads PAD1_Col may be the first direction FD, and the shorter width direction of the first column line pads PAD1_Col may be the second direction SD.

Referring again to FIGS. 6 to 9, when bonding the cell wafer CW and the peripheral wafer PW, the wafers may be aligned based on the second direction SD. In this case, pad alignment accuracy in the second direction SD may be increased, however, pad alignment accuracy in the first direction FD cannot be ensured, so pad alignment accuracy in the first direction FD may decrease. As described above with reference to FIGS. 6 to 9, the longer width directions of the first and second row line pads PAD1_Row and PAD2_Row and the longer width directions of the first and second column line pads PAD1_Col and PAD2_Col are all the same as the first direction FD. Thus, the alignment margin between the first row line pads PAD1_Row and the second row line pads PAD2_Row in the first direction FD and the alignment margin between the first column line pads PAD1_Col and the second column line pads PAD2_Col in the first direction FD will be sufficiently large enough to account for misalignment in the first direction FD. Therefore, even if pad alignment accuracy in the first direction FD is low because the wafers are aligned based on the second direction SD, a pad coupling failure may be suppressed or prevented.

Figure 10:
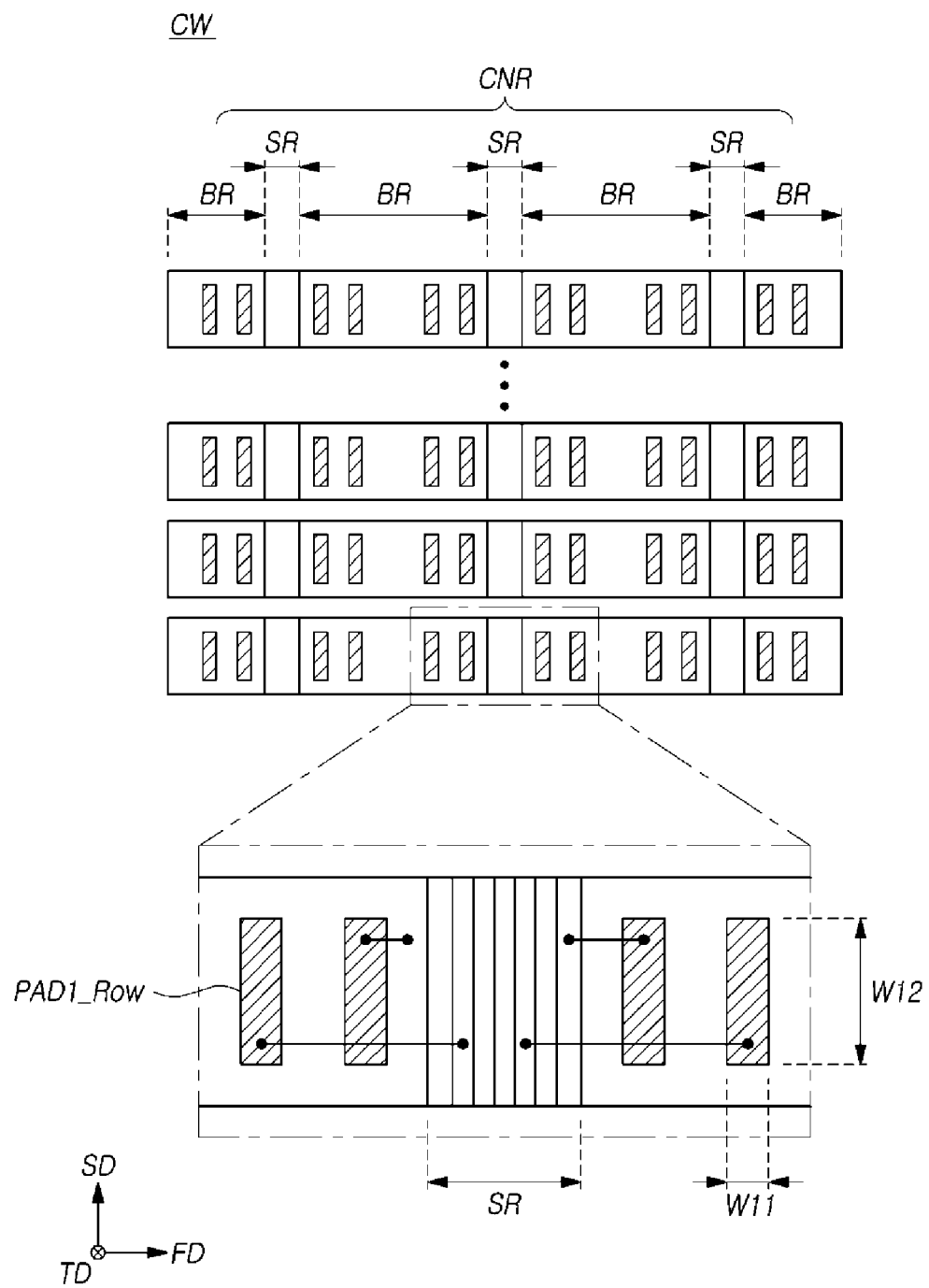
FIG. 10 is a top view illustrating a representation of an example of the layout of pads, in a coupling region, of a cell wafer in accordance with another embodiment of the disclosure.
Figure 11:
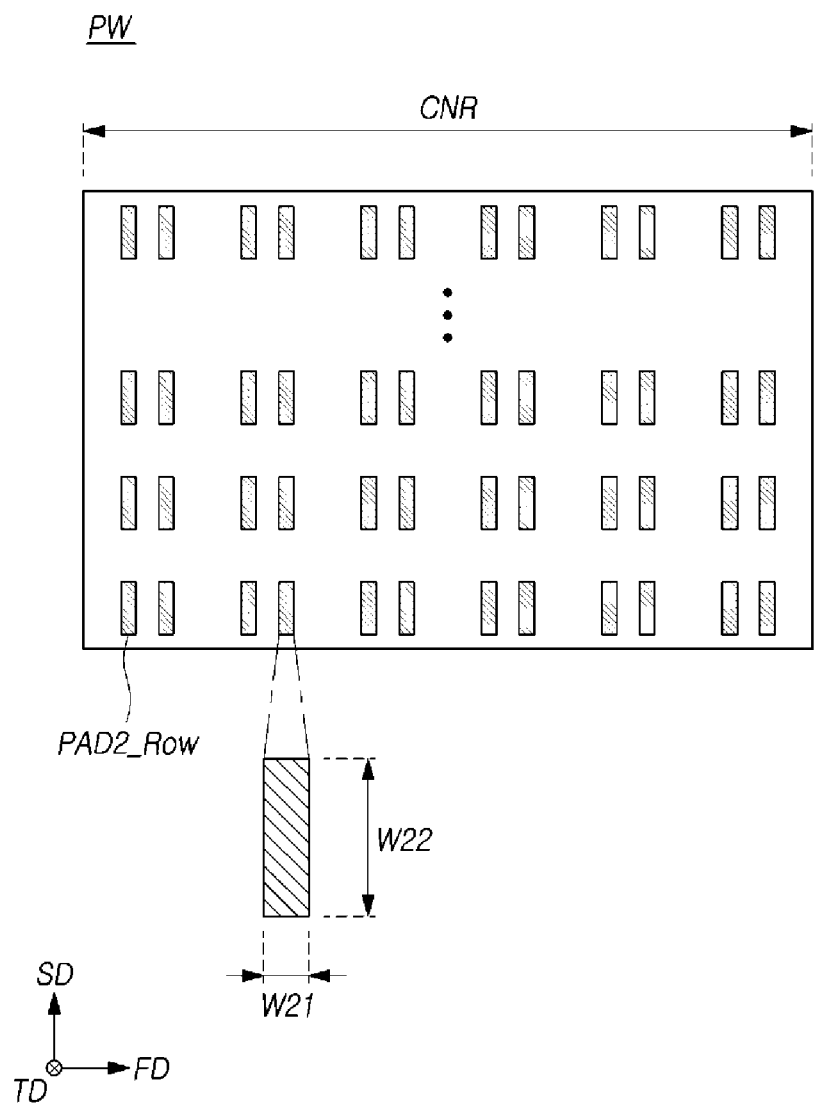
FIG. 11 is a top view illustrating a representation of an example of the layout of pads, in a coupling region, of a peripheral wafer in accordance with the embodiment of the disclosure.
Figure 12:
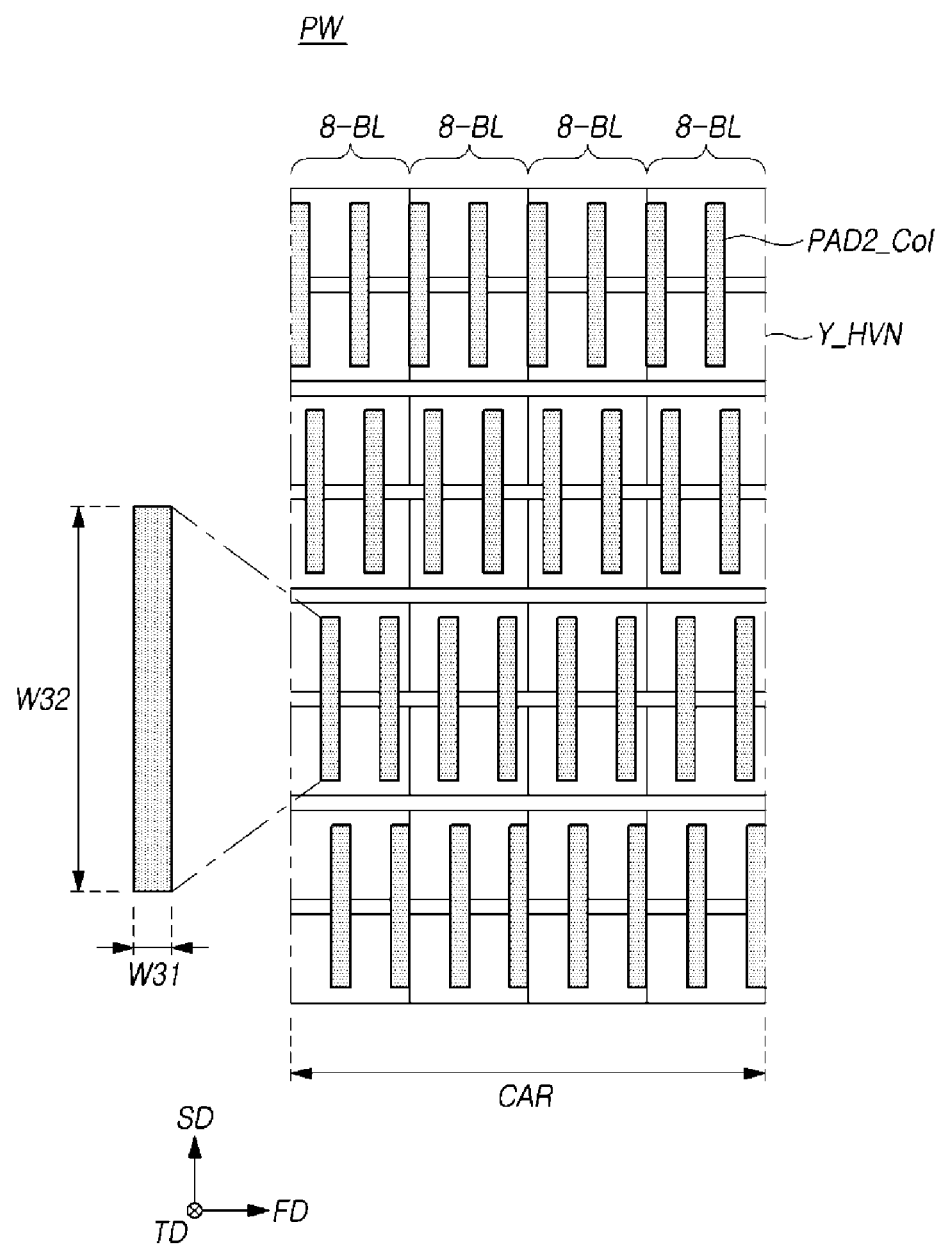
FIG. 12 is a top view illustrating a representation of an example of the layout of pads, in a cell region, of the peripheral wafer in accordance with the embodiment of the disclosure.
Figure 13:
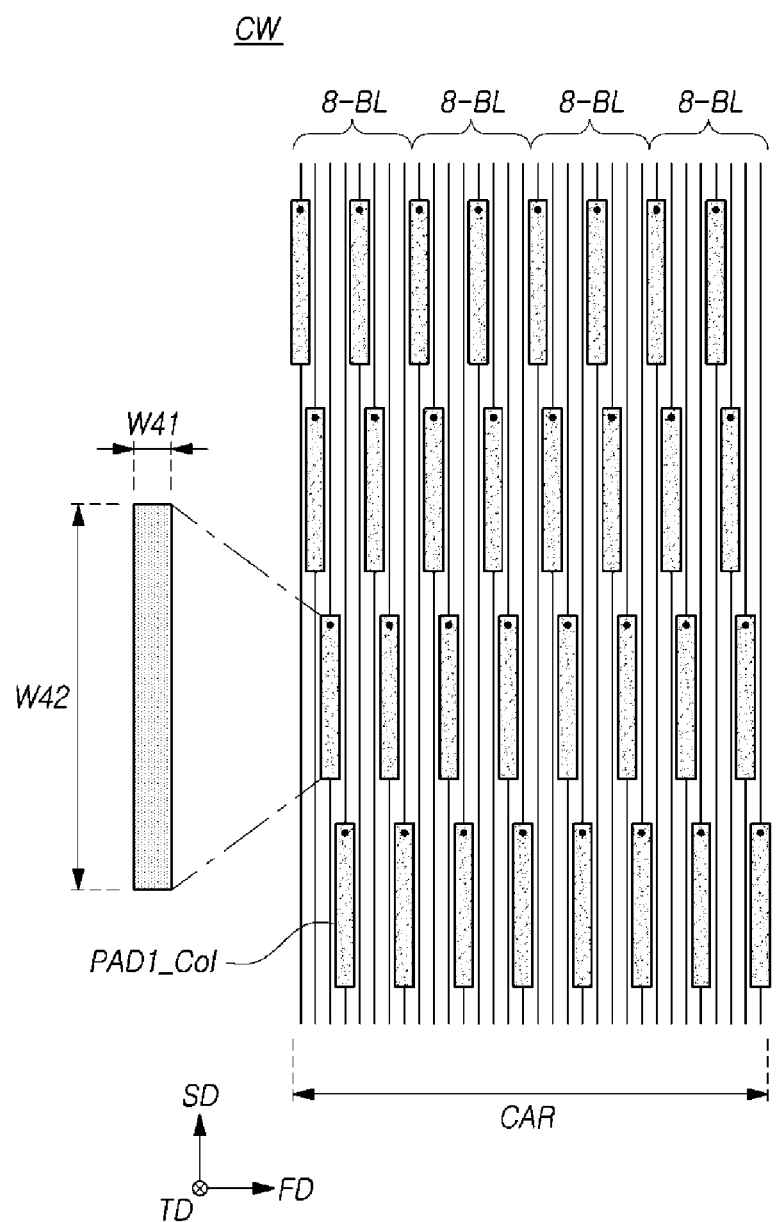
FIG. 13 is a top view illustrating a representation of an example of the layout of pads, in a cell region, of the cell wafer in accordance with the embodiment of the disclosure.
Figure 14:
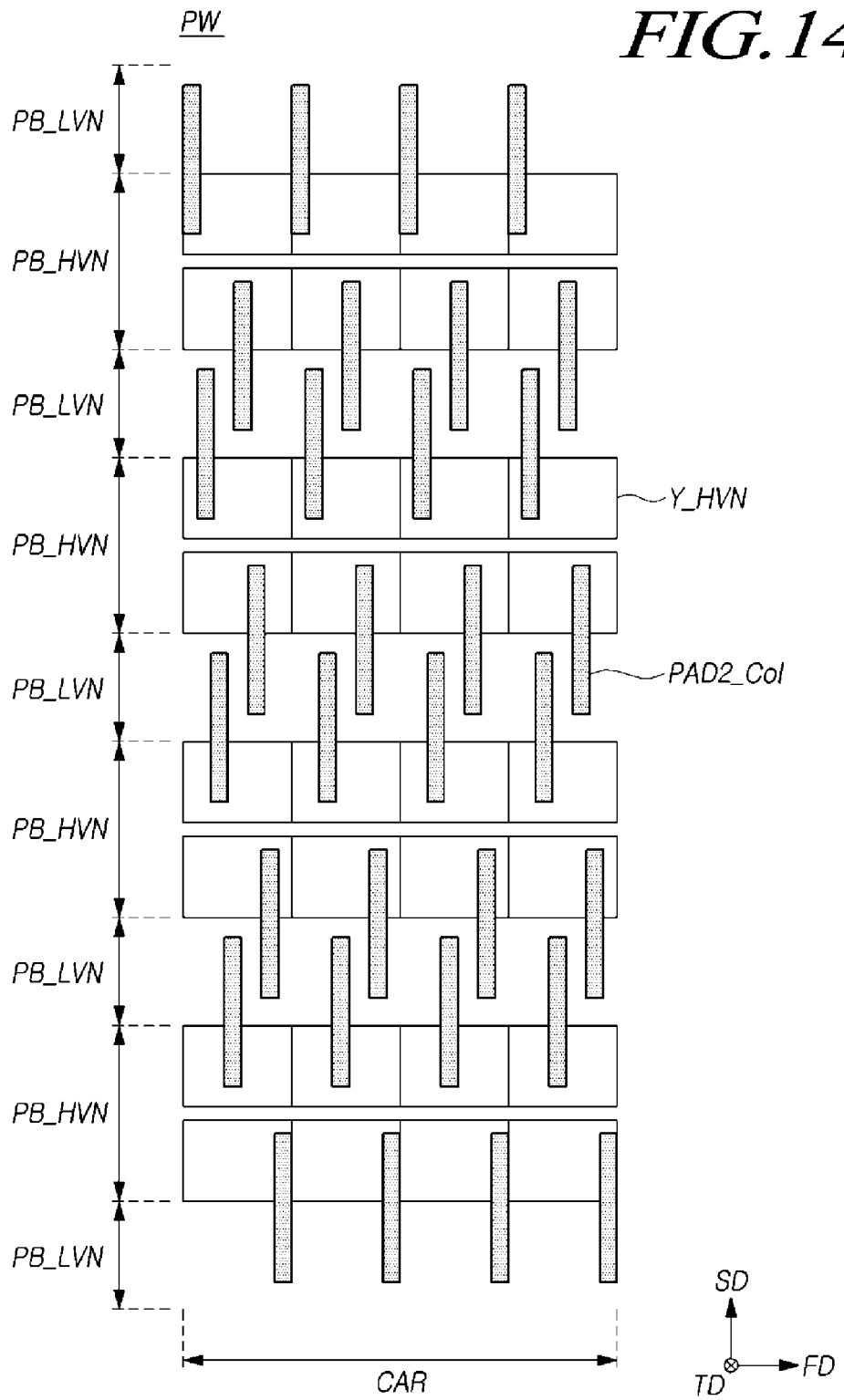
FIG. 14 is a top view illustrating a representation of an example of the layout of pads, in a cell region, of a peripheral wafer in accordance with another embodiment of the disclosure.

FIGS. 10 to 14 are top views illustrating representations of layouts of semiconductor memory devices in accordance with embodiments of the disclosure. In detail, FIG. 10 is a top view illustrating a representation of a coupling region CNR of a cell wafer CW in accordance with an embodiment of the disclosure, FIG. 11 is a top view illustrating a representation of a coupling region CNR of a peripheral wafer PW in accordance with an embodiment of the disclosure, FIG. 12 is a top view illustrating a representation of a cell region CAR of a peripheral wafer PW in accordance with an embodiment of the disclosure, FIG. 13 is a top view illustrating a representation of a cell region CAR of a cell wafer CW in accordance with an embodiment of the disclosure, and FIG. 14 is a top view illustrating a representation of a cell region CAR of a peripheral wafer PW in accordance with still another embodiment of the disclosure.

Referring to FIG. 10, a plurality of first row line pads PAD1_Row may be disposed in the coupling region CNR of the cell wafer CW. The plurality of first row line pads PAD1_Row may be two-dimensionally arranged in the first direction FD and the second direction SD. The width of the first row line pad PAD1_Row in the first direction FD may be W11, and the width of the first row line pad PAD1_Row in the second direction SD may be W12. W12 may be larger than W11. The first row line pads PAD1_Row may have an elongated shape in the second direction SD. The longer width direction of the first row line pads PAD1_Row may be the second direction SD, and the shorter width direction of the first row line pads PAD1_Row may be the first direction FD.

Referring to FIG. 11, a plurality of second row line pads PAD2_Row may be disposed in the coupling region CNR of the peripheral wafer PW. Similar to the first row line pads PAD1_Row, the second row line pads PAD2_Row may be two-dimensionally arranged in the first direction FD and the second direction SD. The width of the second row line pad PAD2_Row in the first direction FD may be W21, and the width of the second row line pad PAD2_Row in the second direction SD may be W22. W22 may be larger than W21. The second row line pads PAD2_Row may have an elongated shape in the second direction SD. The longer width direction of the second row line pads PAD2_Row may be the second direction SD, and the shorter width direction of the second row line pads PAD2_Row may be the first direction FD.

Referring to FIG. 12, a plurality of second column line pads PAD2_Col may be disposed in the cell region CAR of the peripheral wafer PW. The plurality of second column line pads PAD2_Col may overlap with bit line select transistors Y_HVN in the third direction TD. Similar to the bit line select transistors Y_HVN, which are two-dimensionally arranged in the first direction FD and the second direction SD, the second column line pads PAD2_Col may also be two-dimensionally arranged in the first direction FD and the second direction SD.

The width of the second column line pad PAD2_Col in the first direction FD may be W31, and the width of the second column line pad PAD2_Col in the second direction SD may be W32. W32 may be larger than W31. The second column line pads PAD2_Col may have an elongated shape in the second direction SD. The longer width direction of the second column line pads PAD2_Col may be the second direction SD, and the shorter width direction of the second column line pads PAD2_Col may be the first direction FD.

The width of each second column line pad PAD2_Col in the second direction SD may be larger than the pitch of the bit line select transistors Y_HVN in the second direction SD. Each second column line pad PAD2_Col may overlap with at least two bit line select transistors Y_HVN that are adjacent to each other in the second direction SD. The width of the second column line pad PAD2_Col in the first direction FD may be smaller than the pitch of the bit line select transistors Y_HVN in the first direction FD. For example, the width of each second column line pad PAD2_Col in the first direction FD may be smaller than half the pitch of the bit line select transistors Y_HVN in the first direction FD.

Referring to FIG. 13, a plurality of first column line pads PAD1_Col may be disposed in the cell region CAR of the cell wafer CW. Similar to the second column line pads PAD2_Col (see FIG. 12), the first column line pads PAD1_Col may be two-dimensionally arranged in the first direction FD and the second direction SD. The width of the first column line pad PAD1_Col in the first direction FD may be W41, and the width of the first column line pad PAD1_Col in the second direction SD may be W42. W42 may be larger than W41. The first column line pads PAD1_Col may have an elongated shape in the second direction SD. The longer width direction of the first column line pads PAD1_Col may be the second direction SD, and the shorter width direction of the first column line pads PAD1_Col may be the first direction FD.

Referring to FIG. 14, the cell region CAR may include a plurality of page buffer low-voltage regions PB_LVN and a plurality of page buffer high-voltage regions PB_HVN. The page buffer low-voltage regions PB_LVN may be arranged in the second direction SD. Each of the page buffer high-voltage regions PB_HVN may be disposed, in the second direction SD, between a pair of adjacent page buffer low-voltage regions PB_LVN. The page buffer low-voltage regions PB_LVN and the page buffer high-voltage regions PB_HVN may be alternately disposed in the second direction SD.

Bit line select transistors Y_HVN of page buffers may be disposed in the page buffer high-voltage regions PB_HVN. For example, if four page buffer high-voltage regions PB_HVN are included and the bit line select transistors Y_HVN are disposed in eight rows, then the bit line select transistors Y_HVN may be disposed in two rows in each of the page buffer high-voltage regions PB_HVN. Although not illustrated, latch circuits of the page buffers may be disposed in the page buffer low-voltage regions PB_LVN.

A plurality of second column line pads PAD2_Col may be disposed in the cell region CAR of the peripheral wafer PW. The second column line pads PAD2_Col may overlap with the page buffer high-voltage regions PB_HVN and the page buffer low-voltage regions PB_LVN in the third direction TD. For instance, each of the second column line pads PAD2_Col may overlap with at least one page buffer high-voltage region PB_HVN and at least one page buffer low-voltage region PB_LVN that are adjacent to each other.

Referring again to FIGS. 10 to 14, when bonding the cell wafer CW and the peripheral wafer PW, the pads may be aligned based on the first direction FD. In this case, pad alignment accuracy in the first direction FD may be increased, however, pad alignment accuracy in the second direction SD cannot be ensured, so pad alignment accuracy in the second direction SD may decrease. As described above with reference to FIGS. 10 to 14, the longer width directions of the first and second row line pads PAD1_Row and PAD2_Row and the longer width directions of the first and second column line pads PAD1_Col and PAD2_Col are all the same as the second direction SD. Thus, the alignment margin between the first row line pads PAD1_Row and the second row line pads PAD2_Row in the second direction SD and the alignment margin between the first column line pads PAD1_Col and the second column line pads PAD2_Col in the second direction SD will be sufficiently large enough to account for misalignment in the second direction SD. Therefore, even if pad alignment accuracy in the second direction SD is low because the wafers are aligned based on the first direction FD, a pad coupling failure may be suppressed or prevented.

Figure 15:
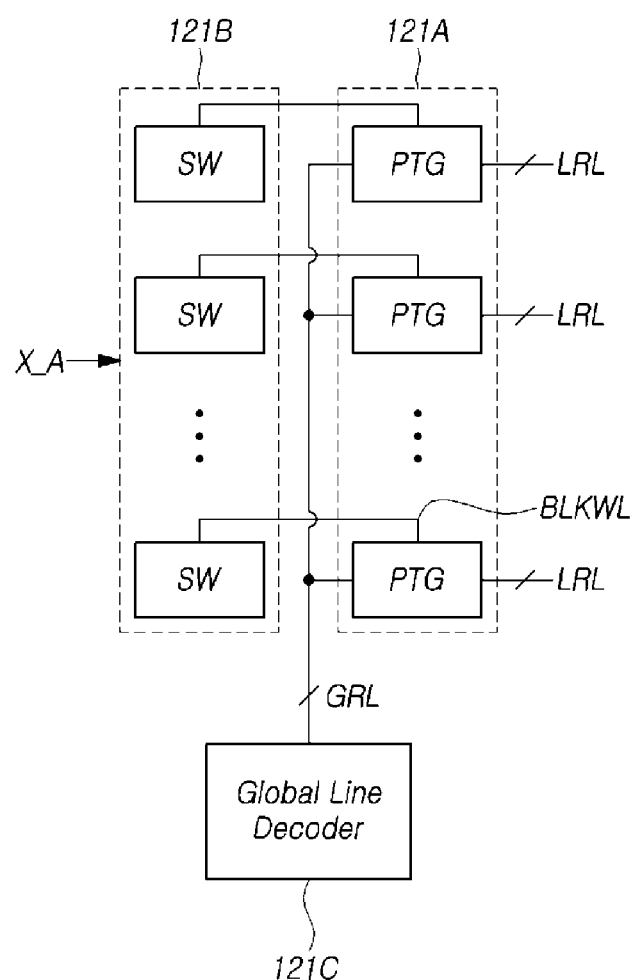
FIG. 15 is a block diagram illustrating a representation of a row decoder related to the disclosure.
Figure 16:
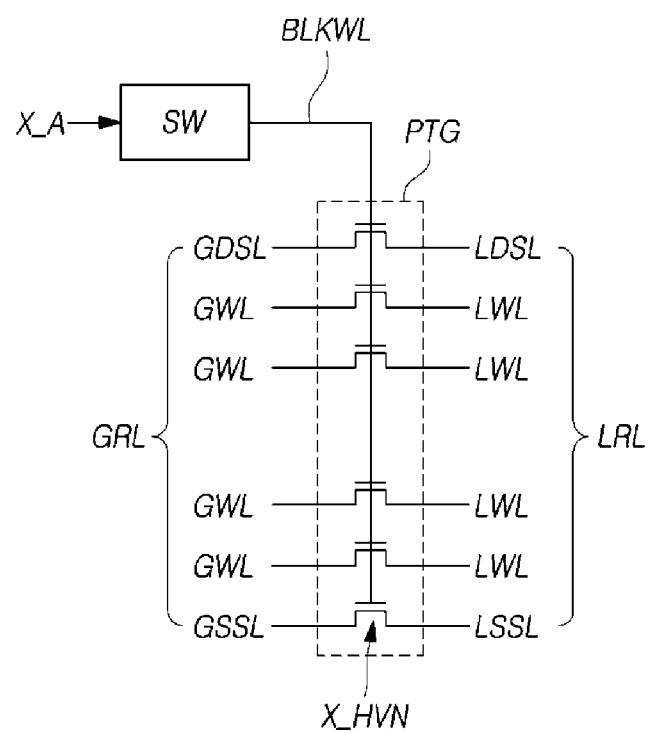
FIG. 16 is a block diagram illustrating a representation of a pass transistor group and a corresponding block switch illustrated in FIG. 15.

FIG. 15 is a block diagram illustrating a representation of a row decoder related to the disclosure, and FIG. 16 is a block diagram illustrating a representation of a pass transistor group PTG and a corresponding block switch SW illustrated in FIG. 15.

Referring to FIG. 15, a row decoder 121 may include a pass transistor circuit 121A, a block decoder 121B and a global line decoder 121C.

The pass transistor circuit 121A may include a plurality of pass transistor groups PTG. The plurality of pass transistor groups PTG may be coupled respectively to a plurality of memory blocks (BLK of FIG. 1). Each of the pass transistor groups PTG may be coupled to a corresponding memory block through a local line LRL. The pass transistor groups PTG may be coupled in common to a global line GRL, and may be coupled to the global line decoder 121C through the global line GRL. A local line LRL may be provided for each individual pass transistor group PTG. The global line GRL may be provided in common for the pass transistor groups PTG. The plurality of pass transistor groups PTG may share the global line GRL.

The block decoder 121B may select one of the pass transistor groups PTG included in the pass transistor circuit 121A in response to a row address X_A received from a peripheral circuit (123 of FIG. 1). The block decoder 121B may include a plurality of block switches SW, which are coupled to the plurality of pass transistor groups PTG, respectively. When the row address X_A is received from the peripheral circuit, any one of the block switches SW may be activated in response to the received row address X_A. The activated block switch SW may transfer a signal, provided from the peripheral circuit, to a corresponding pass transistor group PTG through a block line BLKWL.

The pass transistor group PTG selected by the block decoder 121B, that is, provided with the signal from the block decoder 121B, may couple the local line LRL coupled to a corresponding memory block, to the global lines GRL.

Referring to FIG. 16, the pass transistor group PTG may include a plurality of pass transistors X_HVN, which are coupled between the plurality of global lines GRL and the plurality of local lines LRL. The plurality of global lines GRL may include at least one global drain select line GDSL, a plurality of global word lines GWL and at least one global source select line GSSL. The plurality of local lines LRL may include at least one local drain select line LDSL, a plurality of local word lines LWL and at least one local source select line LSSL.

The number of the pass transistors X_HVN included in the pass transistor group PTG may be substantially the same as the number of row lines (RL of FIG. 1) included in a corresponding memory block. The block switch SW may be coupled in common to the gates of the pass transistors X_HVN, which are included in the pass transistor group PTG, through the block line BLKWL. The block switch SW may receive a signal from the peripheral circuit (123 of FIG. 1), and may transfer the signal, received from the peripheral circuit, to the block line BLKWL in response to the row address X_A.

The pass transistors X_HVN may couple the plurality of global lines GRL and the plurality of local lines LRL in response to the signal applied to the block line BLKWL, and may transfer operating voltages, loaded to the global lines GRL, to the local lines LRL.

Figure 17:
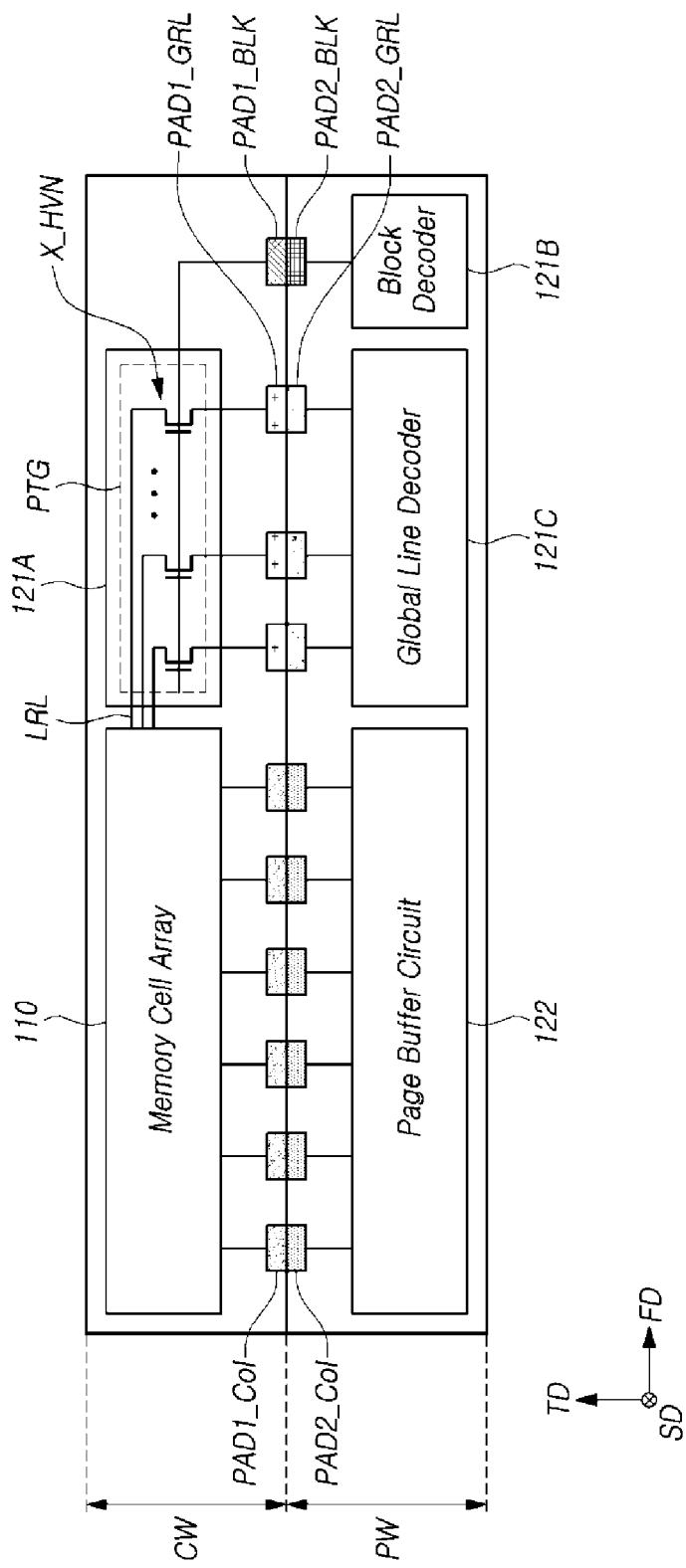
FIG. 17 is a schematic cross-sectional view illustrating a representation of a semiconductor memory device in accordance with another embodiment of the disclosure.

FIG. 17 is a schematic cross-sectional view illustrating a representation of a semiconductor memory device in accordance with another embodiment of the disclosure.

Referring to FIG. 17, a semiconductor memory device in accordance with an embodiment of the disclosure may include a peripheral wafer PW and a cell wafer CW that is stacked on the peripheral wafer PW. FIG. 17 illustrates a case in which one cell wafer CW is stacked on the peripheral wafer PW, but the number of cell wafers CW stacked on the peripheral wafer PW may be two or more.

The cell wafer CW may include a memory cell array 110 and a pass transistor circuit 121A. A plurality of pass transistors X_HVN included in the pass transistor circuit 121A may be coupled to the memory cell array 110 through a plurality of local lines LRL.

The cell wafer CW may include a plurality of first column line pads PAD1_Col, a plurality of first global line pads PAD1_GRL and a first block line pad PAD1_BLK, all on one surface thereof, which is bonded to the peripheral wafer PW.

While only one pass transistor group PTG is illustrated in FIG. 17, it should be understood that the same number of pass transistor groups PTG as the number of memory blocks included in the memory cell array 110 may be included in the pass transistor circuit 121A. FIG. 17 illustrates only one first block line pad PAD1_BLK, but it should be understood that the same number of first block line pads PAD1_BLK as the number of the memory blocks included in the memory cell array 110 may be included in the cell wafer CW.

The plurality of first column line pads PAD1_Col may be coupled to bit lines (not illustrated) of the memory cell array 110, respectively. The plurality of first global line pads PAD1_GRL may be coupled to respective terminals of the plurality of pass transistors X_HVN included in the pass transistor group PTG. The first block line pad PAD1_BLK may be coupled in common to the gates of the plurality of pass transistors X_HVN included in the pass transistor group PTG.

The peripheral wafer PW may include a block decoder 121B, a global line decoder 121C, and a page buffer circuit 122. Although not illustrated, the peripheral wafer PW may further include a peripheral circuit (123 of FIG. 1). The peripheral wafer PW may include, on one surface thereof, a plurality of second column line pads PAD2_Col, a plurality of second global line pads PAD2_GRL and a second block line pad PAD2_BLK bonded to the cell wafer CW through the one surface.

The plurality of second column line pads PAD2_Col may be coupled to the page buffer circuit 122. The plurality of second global line pads PAD2_GRL may be coupled to the global line decoder 121C. The second block line pad PAD2_BLK may be coupled to the block decoder 121B. FIG. 17 illustrates only one second block line pad PAD2_BLK, but it should be understood that the same number of second block line pads PAD2_BLK as the number of the memory blocks included in the memory cell array 110 are included in the peripheral wafer PW.

The cell wafer CW may be bonded onto the peripheral wafer PW such that the plurality of first column line pads PAD1_Col and the plurality of second column line pads PAD2_Col that correspond to each other are coupled to each other, the plurality of first global line pads PAD1_GRL and the plurality of second global line pads PAD2_GRL that correspond to each other are coupled to each other, and the first block line pad PAD1_BLK and the second block line pad PAD2_BLK that correspond to each other are coupled to each other.

Figure 18:
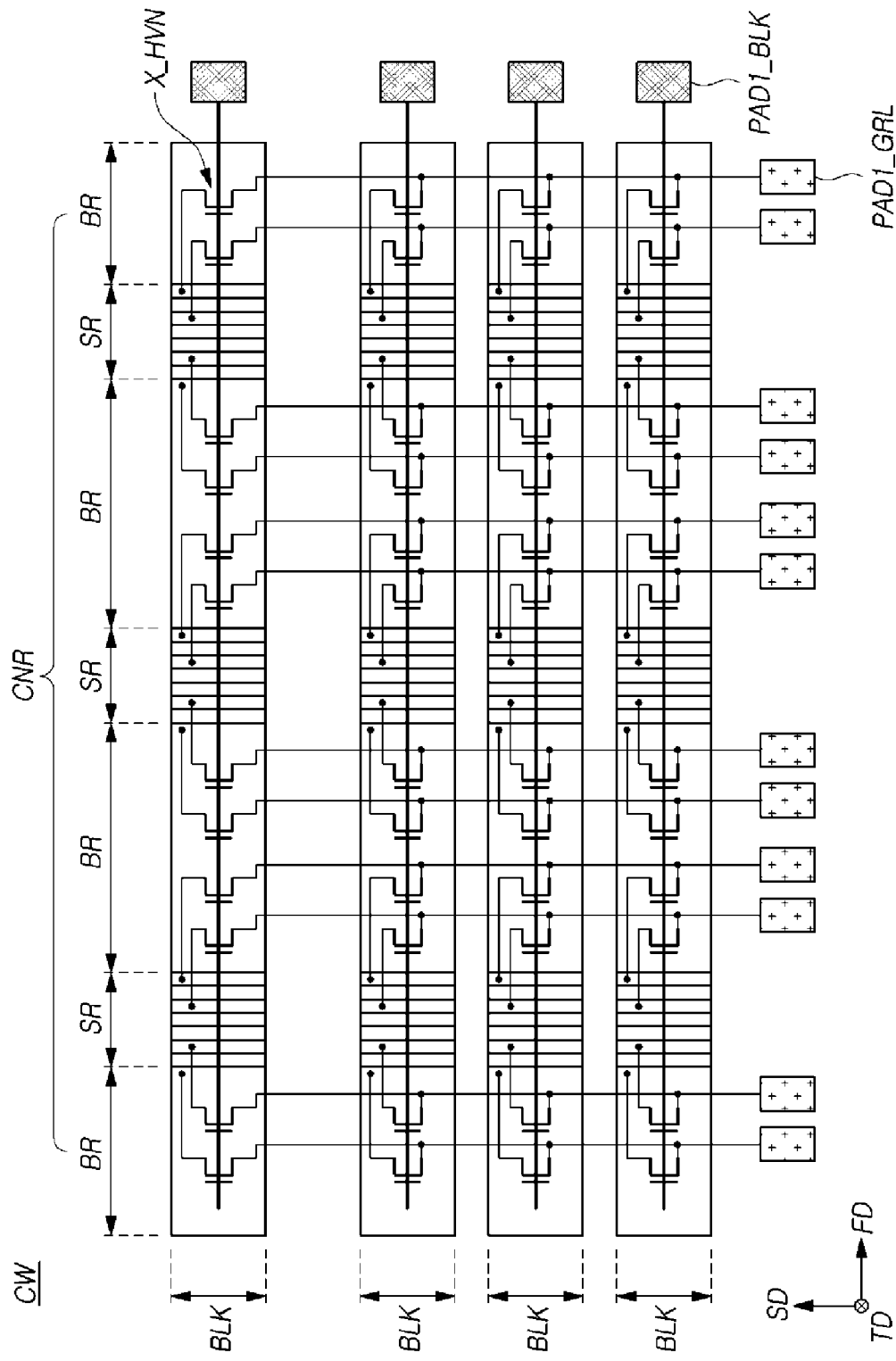
FIG. 18 is a diagram schematically illustrating a representation of an example of a coupling region of a cell wafer of FIG. 17.

FIG. 18 is a diagram schematically illustrating a representation of a coupling region of a cell wafer of FIG. 17.

Referring to FIG. 18, a plurality of pass transistors X_HVN may be coupled to each of a plurality of memory blocks BLK. The plurality of pass transistors X_HVN coupled to each memory block BLK may be included in a single pass transistor group (PTG of FIG. 15). The gates of the pass transistors X_HVN that are coupled to a single memory block BLK may be coupled to one first block line pad PAD1_BLK. The first block line pad PAD1_BLK may be provided for each memory block BLK. The number of first block line pads PAD1_BLK may be substantially the same as the number of memory blocks BLK.

Each first global line pad PAD1_GRL may be coupled in common to a terminal of a pass transistor X_HVN in each of the different memory block BLK. If the memory blocks BLK have the same number of pass transistors X_HVN coupled to each memory block BLK, then the number of the first global line pads PAD1_GRL may be substantially the same as the number of pass transistors X_HVN that are coupled to a single memory block BLK.

Figure 19:
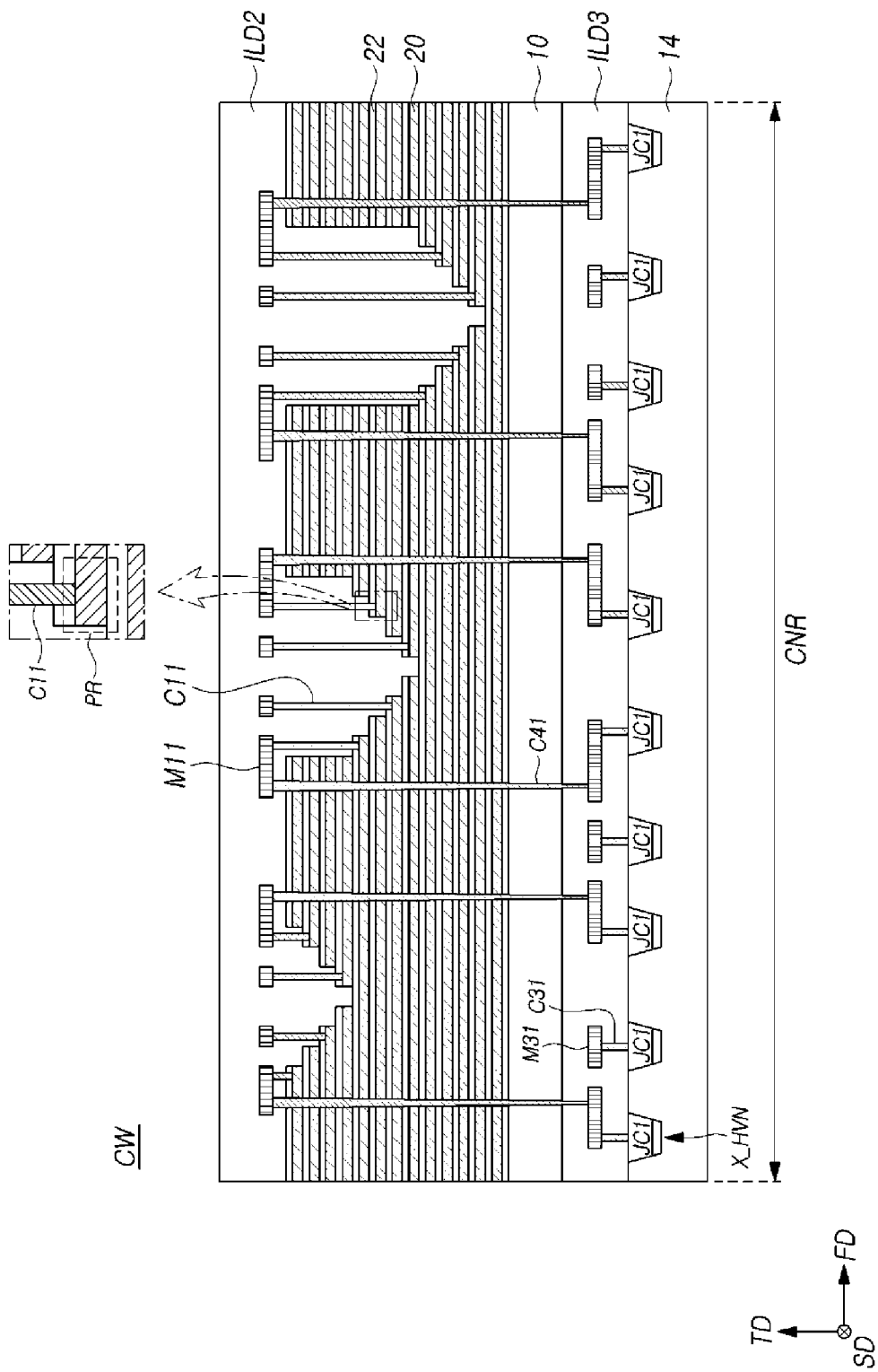
FIG. 19 is a cross-sectional view illustrating a representation of a coupling region of the cell wafer of FIG. 18.

FIG. 19 is a cross-sectional view illustrating a representation of a coupling region of the cell wafer of FIG. 18.

Referring to FIG. 19, the cell wafer CW may include a plurality of pass transistors X_HVN that are defined on a third substrate 14 below a first substrate 10. The plurality of pass transistors X_HVN may be disposed in a coupling region CNR, and may overlap, in the third direction TD, with a plurality of electrode layers 20 and a plurality of interlayer dielectric layers 22, which are alternately stacked.

A dielectric layer ILD3 may be defined on the third substrate 14 to cover the plurality of pass transistors X_HVN. The first substrate 10 may be disposed on the dielectric layer ILD3. A plurality of wiring lines M31 may be defined in the dielectric layer ILD3. Each of the wiring lines M31 may be coupled to one of the pass transistors X_HVN through a contact C31.

Contacts C11 may be coupled onto pad regions PR of the electrode layers 20, respectively. Each of wiring lines M11, which are defined in a dielectric layer ILD2, may be coupled to one of the electrode layers 20 through the contact C11. A plurality of contacts C41, which pass through the dielectric layer ILD2, the plurality of electrode layers 20 and the plurality of interlayer dielectric layers 22, the first substrate 10 and the dielectric layer ILD3, are defined to couple the wiring lines M11 and the wiring lines M31 to each other.

Although not illustrated, a sidewall dielectric layer may be defined on the side surfaces of the plurality of contacts C41 to isolate the contacts C41 and the electrode layers 20 from each other. Each of the pass transistors X_HVN may be coupled to a corresponding electrode layer 20 through the wiring lines M11 and M31 and the contacts C11, C31 and C41.

Figure 20:
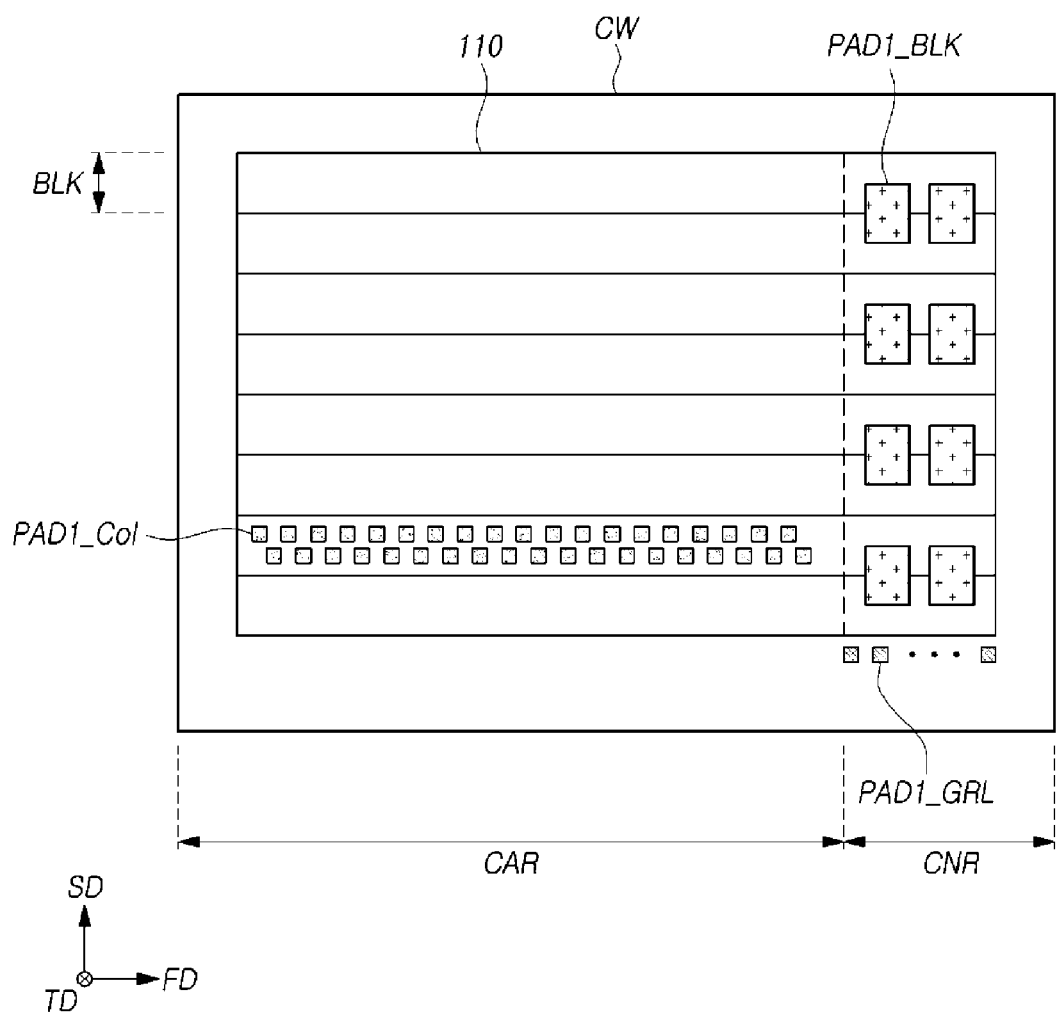
FIG. 20 is a top view illustrating a representation of a layout of pads of the cell wafer of FIG. 17.
Figure 21:
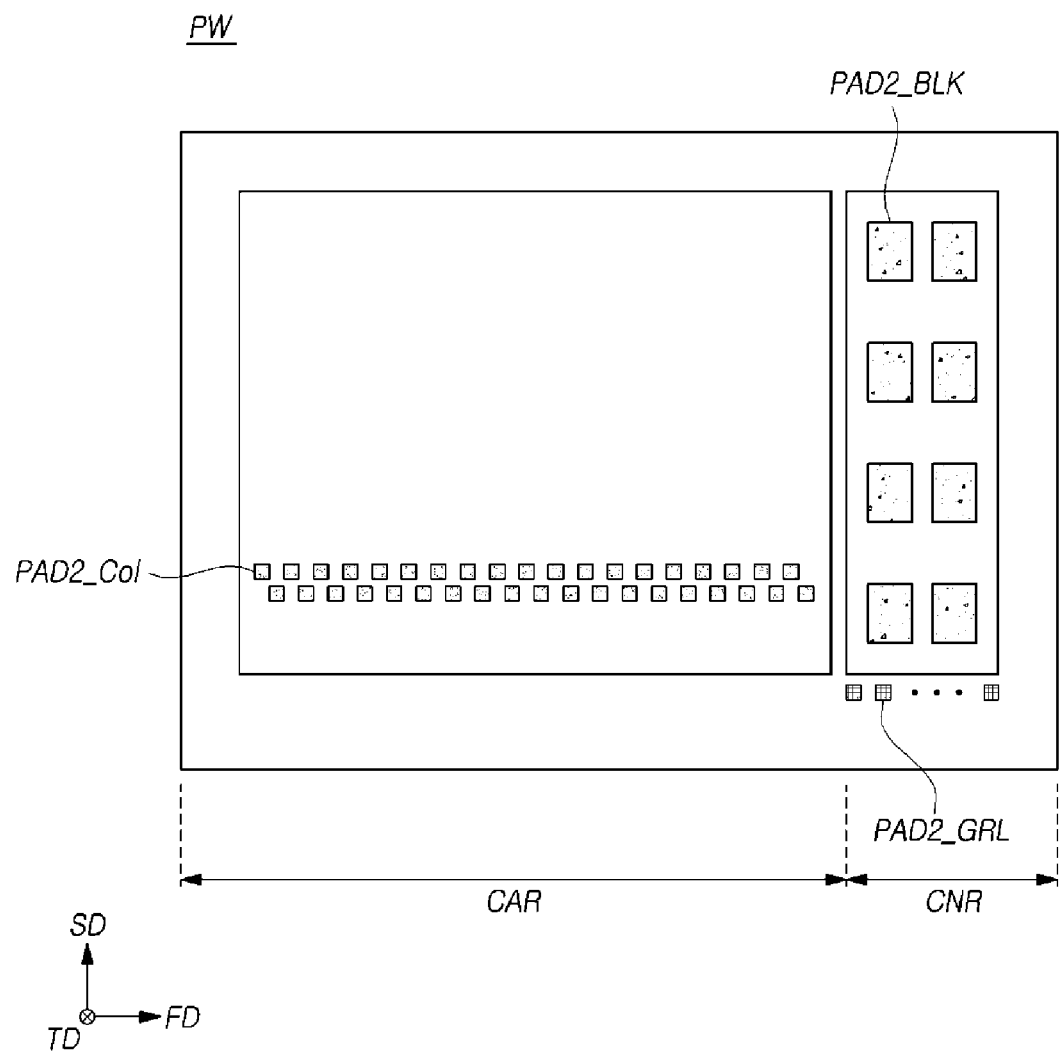
FIG. 21 is a top view illustrating a representation of the layout of pads of a peripheral wafer of FIG. 17.

FIG. 20 is a top view illustrating a representation of a layout of pads of the cell wafer of FIG. 17, and FIG. 21 is a top view illustrating a representation of the layout of pads of a peripheral wafer of FIG. 17.

Referring to FIGS. 20 and 21, first column line pads PAD1_Col may be disposed in a cell region CAR of a cell wafer CW. The first column line pads PAD1_Col may be coupled to bit lines (not illustrated) of a memory cell array 110, respectively. The number of the first column line pads PAD1_Col may be substantially the same as the number of bit lines of the memory cell array 110. The first column line pads PAD1_Col may be arranged in the first direction FD, which is a direction in which the bit lines are arranged.

Second column line pads PAD2_Col may be disposed in a cell region CAR of the peripheral wafer PW. Similar to the first column line pads PAD1_Col, the second column line pads PAD2_Col may be arranged in the first direction FD, which is the direction in which the bit lines are arranged. Similar to the first column line pads PAD1_Col, the number of the second column line pads PAD2_Col may be substantially the same as the number of bit lines of the memory cell array 110. The embodiment in FIGS. 20 and 21 illustrates the first and second column line pads PAD1_Col and PAD2_Col arranged in a zigzag style in the first direction FD.

First block line pads PAD1_BLK may be disposed in a coupling region CNR of the cell wafer CW. The number of the first block line pads PAD1_BLK may be substantially the same as the number of memory blocks BLK included in the memory cell array 110. The first block line pads PAD1_BLK may be arranged in the second direction SD, which is a direction in which the memory blocks BLK are arranged. The first block line pads PAD1_BLK may be disposed in at least two lines or columns that extend in the second direction SD. The embodiment illustrated in FIG. 20 represents a case where the first block line pads PAD1_BLK are disposed in two lines or columns that extend in the second direction SD. In this case, the pitch of the first block line pads PAD1_BLK in the second direction SD may be larger than the pitch of the memory block BLK.

Second block line pads PAD2_BLK may be disposed in a coupling region CNR of the peripheral wafer PW. Similar to the first block line pads PAD1_BLK, the second block line pads PAD2_BLK may be arranged in the second direction SD, which is the direction in which the memory blocks BLK are arranged. Similar to the first block line pads PAD1_BLK, the number of the second block line pads PAD2_BLK may be substantially the same as the number of memory blocks BLK included in the memory cell array 110.

First global line pads PAD1_GRL may be disposed in the coupling region CNR of the cell wafer CW. The number of the first global line pads PAD1_GRL may be substantially the same as the number of row lines (RL of FIG. 1) included in a single memory block BLK. The first global line pads PAD1_GRL may be arranged in the first direction FD along an edge of the coupling region CNR.

Second global line pads PAD2_GRL may be disposed in the coupling region CNR of the peripheral wafer PW. Similar to the first global line pads PAD1_GRL, the second global line pads PAD2_GRL may be arranged in the first direction FD along an edge of the coupling region CNR.

As semiconductor memory devices trend toward a high degree of integration and high capacity, the number of bit lines included in the semiconductor memory device and the stack number of row lines (i.e., electrode layers) included in the semiconductor memory device are increasing. Because the number of the first column line pads PAD1_Col or the second column line pads PAD2_Col is substantially the same as the number of bit lines, if the number of bit lines included in the semiconductor memory device increases, then the number of the first column line pads PAD1_Col or the second column line pads PAD2_Col will also increase. In order to dispose a larger number of the first and second column line pads PAD1_Col and PAD2_Col within a limited layout area, it is necessary to configure the first and second column line pads PAD1_Col and PAD2_Col in a smaller size.

Because the number of the first or second global line pads PAD1_GRL or PAD2_GRL is substantially the same as the number of row lines (i.e., electrode layers) included in a single memory block BLK, if the number of row lines included in the single memory block BLK increases, then the number of the first or second global line pads PAD1_GRL or PAD2_GRL will also increase. In order to dispose a larger number of the first and second global line pads PAD1_GRL and PAD2_GRL within a limited layout area, it is necessary to configure the first and second global line pads PAD1_GRL and PAD2_GRL in a smaller size.

As described above, the number of the first or second block line pads PAD1_BLK or PAD2_BLK is substantially the same as the number of memory blocks included in the semiconductor memory device. Consequently, when the number of bit lines and the number of row lines increase, the number of the first or second block line pads PAD1_BLK or PAD2_BLK may not increase. Accordingly, the first and second block line pads PAD1_BLK and PAD2_BLK may be configured in a larger size. For this reason, the first and second block line pads PAD1_BLK and PAD2_BLK may have a size larger than the first and second column line pads PAD1_Col and PAD2_Col and the first and second global line pads PAD1_GRL and PAD2_GRL.

When bonding the cell wafer CW and the peripheral wafer PW, pads may be aligned based on the first direction FD. In this case, the alignment accuracy of pads that are arranged in the first direction FD may be increased. Therefore, a coupling failure between the first column line pads PAD1_Col and the second column line pads PAD2_Col and a coupling failure between the first global line pads PAD1_GRL and the second global line pads PAD2_GRL may be suppressed or prevented.

On the other hand, if pads are aligned based on the first direction FD when bonding the cell wafer CW and the peripheral wafer PW, then alignment accuracy of pads arranged in the second direction SD cannot be ensured, and so alignment accuracy of pads arranged in the second direction SD may decrease. As described above with reference to FIGS. 20 and 21, because the size of the first and second block line pads PAD1_BLK and PAD2_BLK, which are arranged in the second direction SD, is larger than the size of the first and second column line pads PAD1_Col and PAD2_Col and the first and second global line pads PAD1_GRL and PAD2_GRL, which are arranged in the first direction FD, the alignment margin between the first block line pads PAD1_BLK and the second block line pads PAD2_BLK may be larger than the alignment margin between the first column line pads PAD1_Col and the second column line pads PAD2_Col and the alignment margin between the first global line pads PAD1_GRL and the second global line pads PAD2_GRL. Hence, even when wafers are aligned based on the first direction FD with a reduced pad alignment accuracy in the second direction SD, a coupling failure between the first block line pads PAD1_BLK and the second block line pads PAD2_BLK may be suppressed or prevented.

Figure 22:
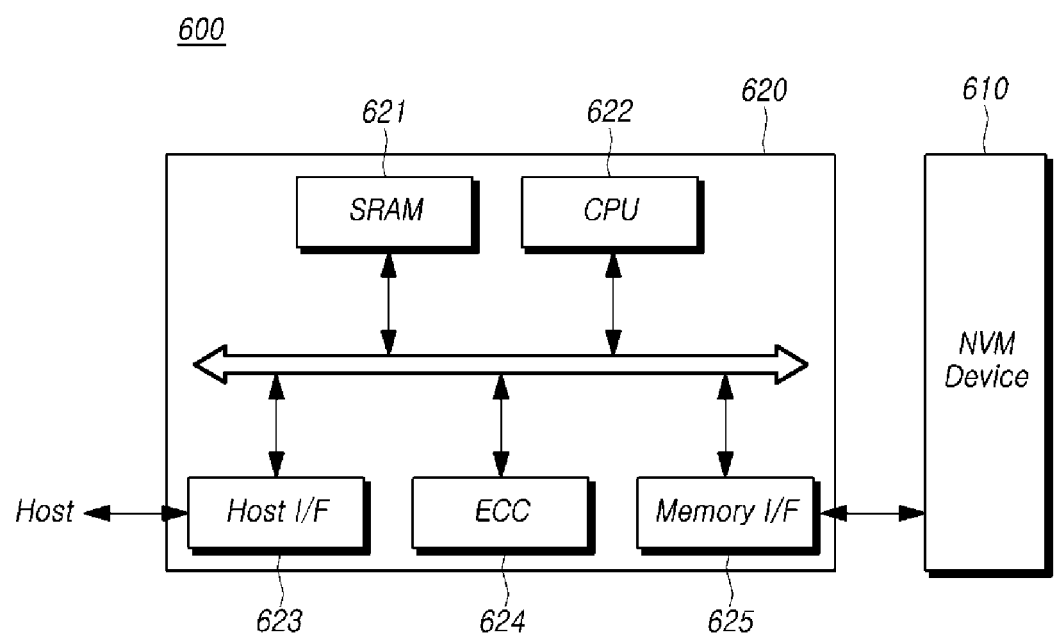
FIG. 22 is a block diagram schematically illustrating a memory system including a semiconductor memory device in accordance with embodiments of the disclosure.

FIG. 22 is a block diagram schematically illustrating a memory system including a semiconductor memory device in accordance with embodiments of the disclosure.

Referring to FIG. 22, a memory system 600 in accordance with an embodiment may include a nonvolatile memory device (NVM Device) 610 and a memory controller 620.

The nonvolatile memory device (NVM Device) 610 may be constituted by a semiconductor memory device described above and may operate in the manner described above. The memory controller 620 may be configured to control the nonvolatile memory device (NVM Device) 610. The combination of the nonvolatile memory device (NVM Device) 610 and the memory controller 620 may be configured as a memory card or a solid state disk (SSD). An SRAM 621 is used as a working memory of a processing unit (CPU) 622. A host interface (Host I/F) 623 includes a data exchange protocol of a host which is coupled with the memory system 600.

An error correction code block (ECC) 624 detects and corrects an error included in data read from the nonvolatile memory device (NVM Device) 610.

A memory interface (MEMORY I/F) 625 interfaces with the nonvolatile memory device (NVM Device) 610 of the present embodiment. The processing unit (CPU) 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Drive Electronics) protocol.

Figure 23:
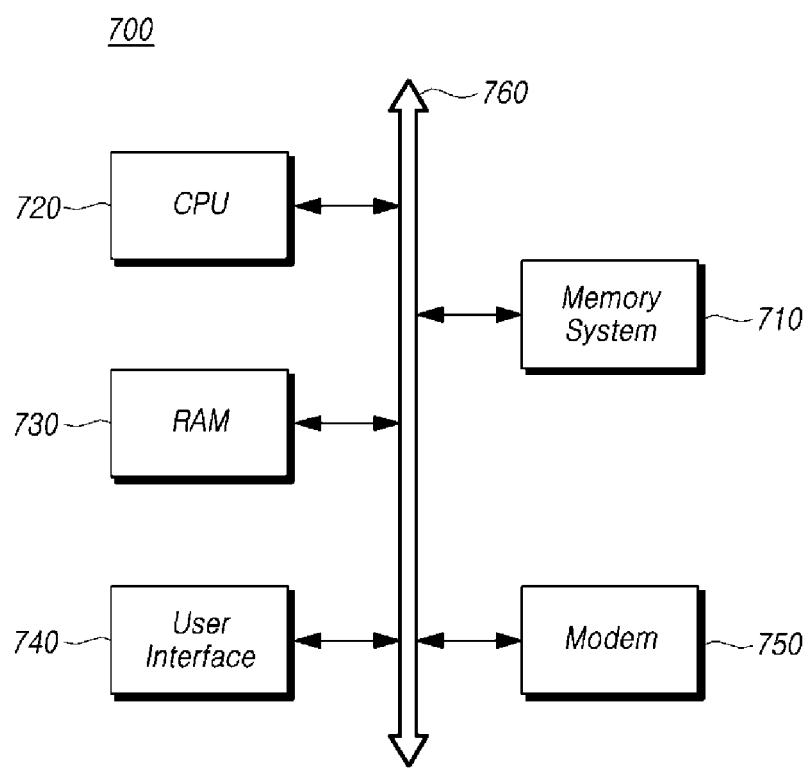
FIG. 23 is a block diagram schematically illustrating a computing system including a semiconductor memory device in accordance with embodiments of the disclosure.

FIG. 23 is a block diagram schematically illustrating a computing system including a semiconductor memory device in accordance with embodiments of the disclosure.

Referring to FIG. 23, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure may be interpreted in connection with the appended claims and encompass all equivalents falling within the scope of the appended claims.

What is claimed is:

1. A semiconductor memory device comprising:
a plurality of first column line pads, having a longer width and a shorter width, defined on one surface of a cell wafer, and coupled to a memory cell array of the cell wafer;
a plurality of second column line pads, having a longer width and a shorter width, defined on one surface of a peripheral wafer that is bonded to the one surface of the cell wafer, coupled to a page buffer circuit of the peripheral wafer, and bonded respectively to the plurality of first column line pads;

a plurality of first row line pads defined on the one surface of the cell wafer, and coupled to the memory cell array; and a plurality of second row line pads defined on the one surface of the peripheral wafer, coupled to a row decoder of the peripheral wafer, and bonded respectively to the plurality of first row line pads, wherein the longer widths of the first and second column line pads and the longer widths of the first and second row line pads extend in the same direction.

2. The semiconductor memory device according to claim 1, wherein the cell wafer and the peripheral wafer are aligned based on the shorter width directions of the first and second column line pads and the first and second row line pads.

3. The semiconductor memory device according to claim 1,
wherein the memory cell array includes a plurality of memory cells that are coupled respectively to the plurality of first column line pads through a plurality of bit lines and are coupled respectively to the plurality of first row line pads through a plurality of row lines,
wherein the plurality of first column line pads and the plurality of first row line pads are two-dimensionally arranged on the one surface of the cell wafer in a first direction as a direction in which the bit lines are arranged and a second direction as a direction in which the bit lines extend, and
wherein the plurality of second column line pads and the plurality of second row line pads are two-dimensionally arranged on the one surface of the peripheral wafer in the first direction and the second direction.

4. The semiconductor memory device according to claim 3, wherein the semiconductor memory device includes a cell region and a coupling region that are disposed in the first direction, the plurality of first column line pads are disposed in the cell region, and the plurality of first row line pads are disposed in the coupling region.

5. The semiconductor memory device according to claim 3, wherein the longer widths of the first and second column line pads and the first and second row line pads extend in the first direction.

6. The semiconductor memory device according to claim 5, wherein the page buffer circuit includes a plurality of bit line select transistors that are coupled respectively to the plurality of bit lines and are two-dimensionally disposed in the first direction and the second direction, and
wherein a width of each of the first and second column line pads in the first direction is larger than a pitch of the bit line select transistors in the first direction.

7. The semiconductor memory device according to claim 3, wherein the longer widths of the first and second column line pads and the first and second row line pads extend in the second direction.

8. The semiconductor memory device according to claim 7,
wherein the page buffer circuit includes a plurality of bit line select transistors that are coupled respectively to the plurality of bit lines and are two-dimensionally disposed in the first direction and the second direction, and
wherein a width of each of the first and second column line pads in the second direction is larger than a pitch of the bit line select transistors in the second direction.

9. The semiconductor memory device according to claim 7,
wherein the semiconductor memory device includes a plurality of page buffer high-voltage regions and a plurality of page buffer low-voltage regions that are alternately disposed in the second direction,
wherein the page buffer circuit includes a plurality of bit line select transistors that are coupled respectively to the plurality of bit lines and are disposed in the plurality of page buffer high-voltage regions, and
wherein each of the first and second column line pads overlaps with at least one of the plurality of page buffer high-voltage regions and at least one of an adjacent page buffer low-voltage region.

10. The semiconductor memory device according to claim 3, wherein the cell wafer comprises:
a substrate having a cell region and a coupling region that are disposed in the first direction;
a plurality of row lines and a plurality of interlayer dielectric layers alternately stacked on the substrate; and
a plurality of vertical channels passing through the plurality of row lines and the plurality of interlayer dielectric layers in the cell region.

11. The semiconductor memory device according to claim 10,
wherein the coupling region includes a plurality of step regions, which have step structures disposed in the first direction with exposed pad regions of row lines from among the plurality of row lines and a plurality of buffer regions that are disposed alternately with the step regions in the first direction, and
wherein the first and second row line pads are disposed in the plurality of buffer regions.

12. A semiconductor memory device comprising:
a plurality of first column line pads, defined on one surface of a cell wafer having a memory cell array and a plurality of pass transistor groups coupled to the memory cell array, and coupled to the memory cell array;
a plurality of second column line pads, defined on one surface of a peripheral wafer that is bonded to the one surface of the cell wafer, and bonded respectively to the plurality of first column line pads;
a plurality of first global line pads defined on the one surface of the cell wafer and coupled in common to at least one of the plurality of pass transistor groups;
a plurality of second global line pads defined on the one surface of the peripheral wafer and bonded to the plurality of first global line pads, respectively;
a plurality of first block line pads defined on the one surface of the cell wafer and coupled to the plurality of pass transistor groups, respectively; and
a plurality of second block line pads defined on the one surface of the peripheral wafer, and bonded to the plurality of first block line pads, respectively,
wherein the first and second block line pads have a size larger than the first and second column line pads and the first and second global line pads, and
wherein the first and second column line pads and the first and second global line pads are arranged in a first direction, and the first and second block line pads are arranged in a second direction different from the first direction.

13. The semiconductor memory device according to claim 12, wherein the cell wafer and the peripheral wafer are aligned based on the first direction.

14. The semiconductor memory device according to claim 12,
wherein the memory cell array includes a plurality of memory cells that are coupled to the plurality of first column line pads through a plurality of bit lines and are coupled to the plurality of first row line pads through a plurality of row lines, and
wherein the first direction is a direction in which the plurality of bit lines are arranged, and the second direction is a direction in which the plurality of bit lines extend.

15. The semiconductor memory device according to claim 12,
wherein the cell wafer includes a plurality of memory blocks that are arranged in the second direction and are coupled to the plurality of pass transistor groups, respectively, and
wherein the number of the plurality of first block line pads or the number of the plurality of second block line pads is the same as the number of the plurality of memory blocks.

16. The semiconductor memory device according to claim 12,
wherein each of the plurality of pass transistor groups includes a plurality of pass transistors, and
wherein the number of the plurality of first global line pads or the number of the plurality of second global line pads is the same as the number of pass transistors included in one of the plurality of pass transistor groups.

17. The semiconductor memory device according to claim 12, wherein the plurality of pass transistor groups overlap with the memory cell array in a direction perpendicular to the one surface.

18. The semiconductor memory device according to claim 17,
wherein the semiconductor memory device includes a cell region and a coupling region that are disposed in the first direction, and
wherein the cell wafer comprises:
a first substrate;
the plurality of pass transistor groups disposed on a second substrate below the first substrate;
a plurality of row lines and a plurality of interlayer dielectric layers alternately stacked on the first substrate; and
a plurality of vertical channels passing through the plurality of row lines and the plurality of interlayer dielectric layers in the cell region.

19. The semiconductor memory device according to claim 18, wherein the first and second column line pads are disposed in the cell region, and the first and second global line pads and the first and second block line pads are disposed in the coupling region.

* * * * *